(12) United States Patent
Aruga et al.

(10) Patent No.: US 7,148,427 B2
(45) Date of Patent: Dec. 12, 2006

(54) WIRING SUBSTRATE, DISPLAY DEVICE, SEMICONDUCTOR CHIP, AND ELECTRONIC EQUIPMENT

(75) Inventors: Yasuhito Aruga, Okaya (JP); Satoshi Yatabe, Shiojiri (JP); Kogo Endo, Chino (JP); Norihito Harada, Matsanoto (JP)

(73) Assignee: Seiko Epson Corporation (JP)

( * ) Notice: Subject to any disclaimer, the term of this patent is extended or adjusted under 35 U.S.C. 154(b) by 485 days.

(21) Appl. No.: 10/000,841

(22) Filed: Oct. 24, 2001

(65) Prior Publication Data
US 2002/0089634 A1 Jul. 11, 2002

(30) Foreign Application Priority Data
Oct. 25, 2000 (JP) .............................. 2000-326073

(51) Int. Cl.
*H05K 1/16* (2006.01)
(52) U.S. Cl. ...................... 174/260; 174/254; 174/257; 351/780; 349/149
(58) Field of Classification Search ................ 174/250, 174/257; 349/149–152, 153–155
See application file for complete search history.

(56) References Cited
U.S. PATENT DOCUMENTS
5,760,855 A * 6/1998 Nakase et al. ................ 349/40
6,133,581 A * 10/2000 Terao et al. ................... 257/40
6,300,995 B1* 10/2001 Wakagi et al. ............... 349/141
6,404,026 B1* 6/2002 Tsuyuki ....................... 257/409
6,414,888 B1* 7/2002 Kitade et al. ................ 365/201
6,432,738 B1* 8/2002 Hatano et al. ................ 438/60

FOREIGN PATENT DOCUMENTS
| JP | 10-215039 | 8/1998 |
| JP | 2000-221537 | 8/2000 |
| JP | 2000-252597 | 9/2000 |
| JP | 2000-294897 | 10/2000 |

OTHER PUBLICATIONS
Communication from Japanese Patent Office re: counterpart application.
* cited by examiner

*Primary Examiner*—Tuan Dinh
(74) *Attorney, Agent, or Firm*—Harness, Dickey & Pierce, P.L.C.

(57) ABSTRACT

A wiring substrate is formed of a plurality of metal wirings 14e formed on a substrate 7c. A guard wiring 29 fabricated of an electrically conductive oxide such as ITO is interposed between at least a pair of adjacent ones of a plurality of metal wirings 14e. When voltages V1, V2, V3, and V4 applied to the metal wirings 14e are related to be V1>V2>V3>V4, a guard wiring 29 is present between a metal wiring 14e functioning as an anode and a metal wiring 14e functioning as a cathode, and the anode metal wiring 14e is prevented from being corroded.

7 Claims, 17 Drawing Sheets

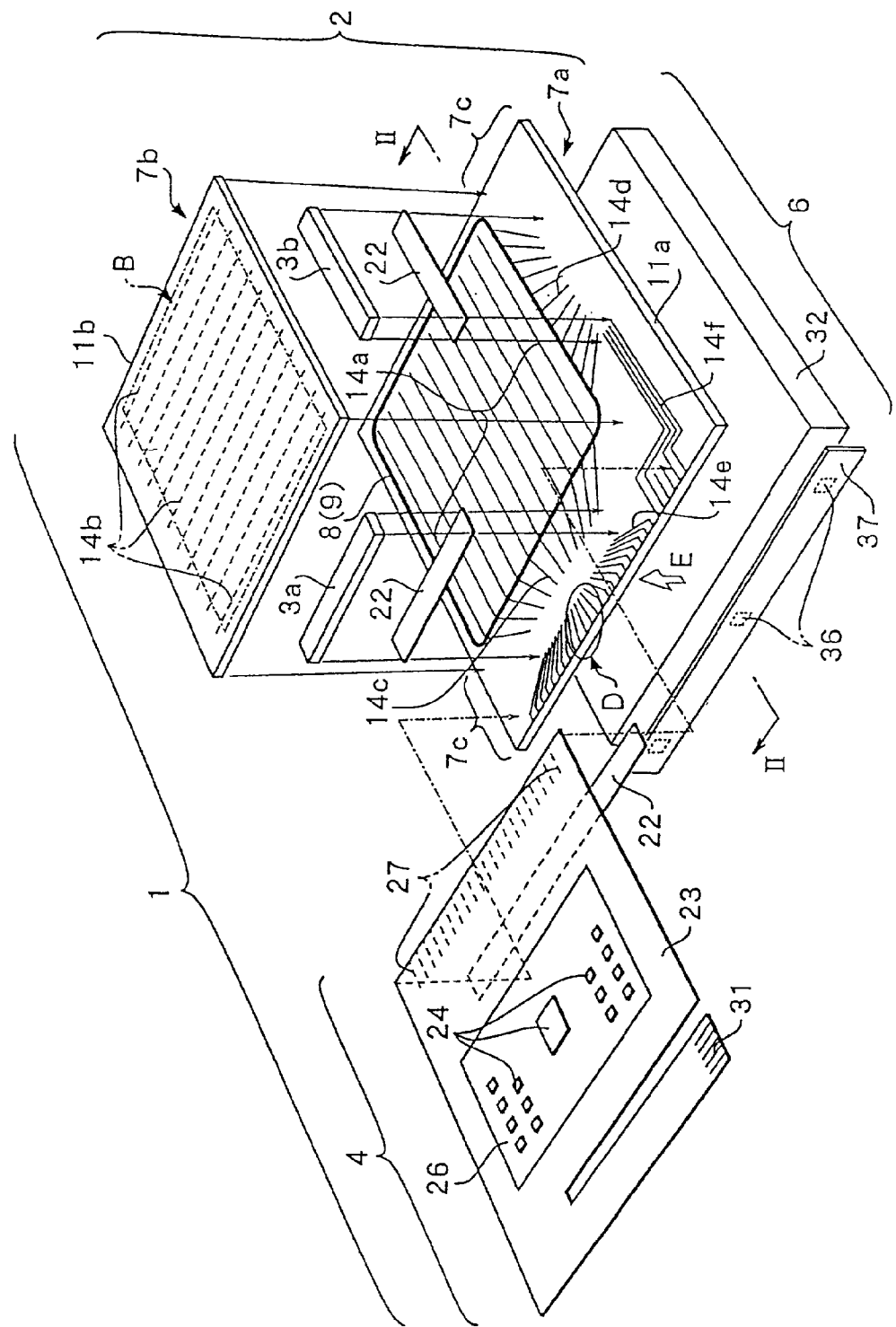
[FIG. 1]

[FIG. 2]
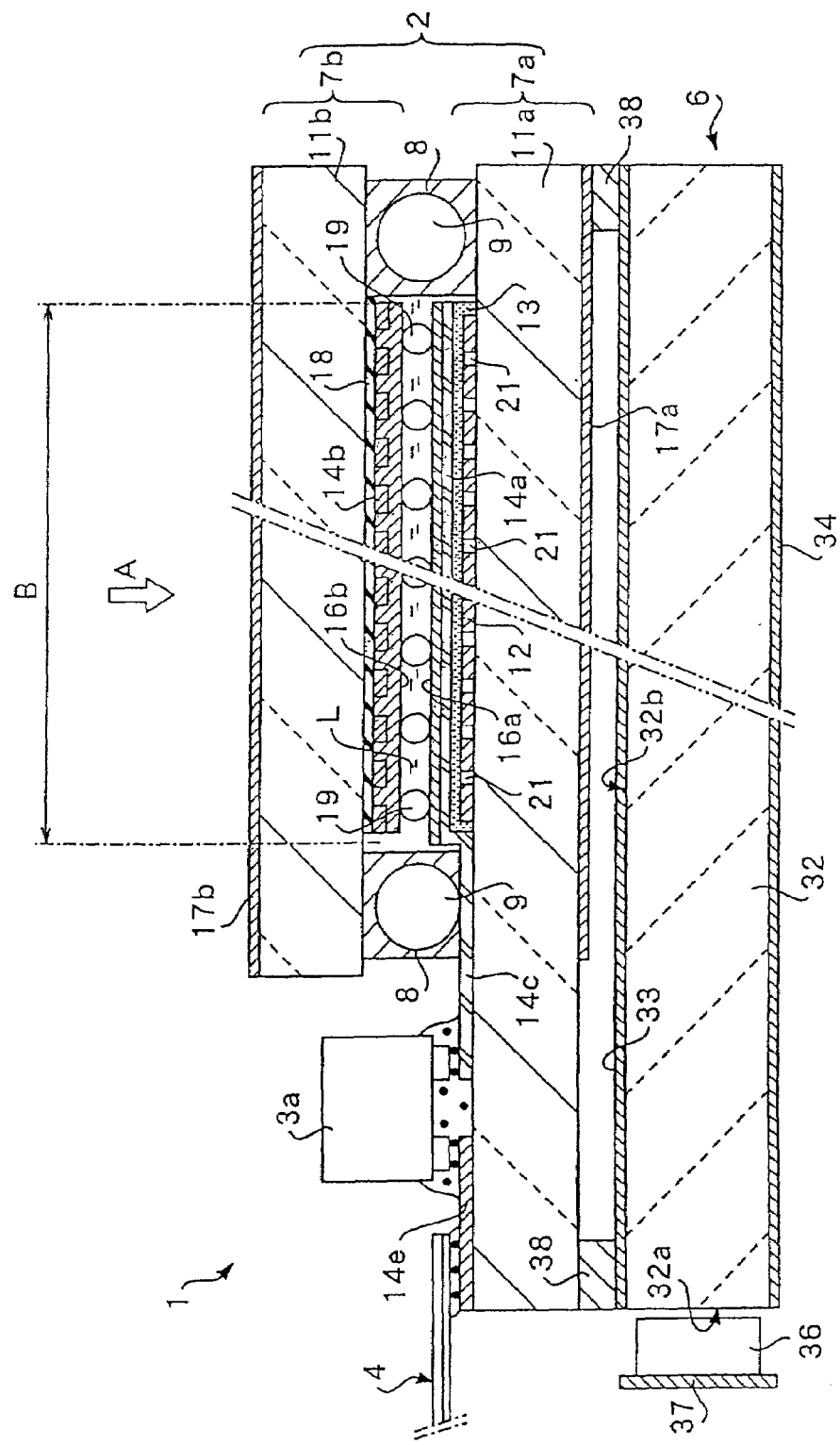

[FIG. 3]
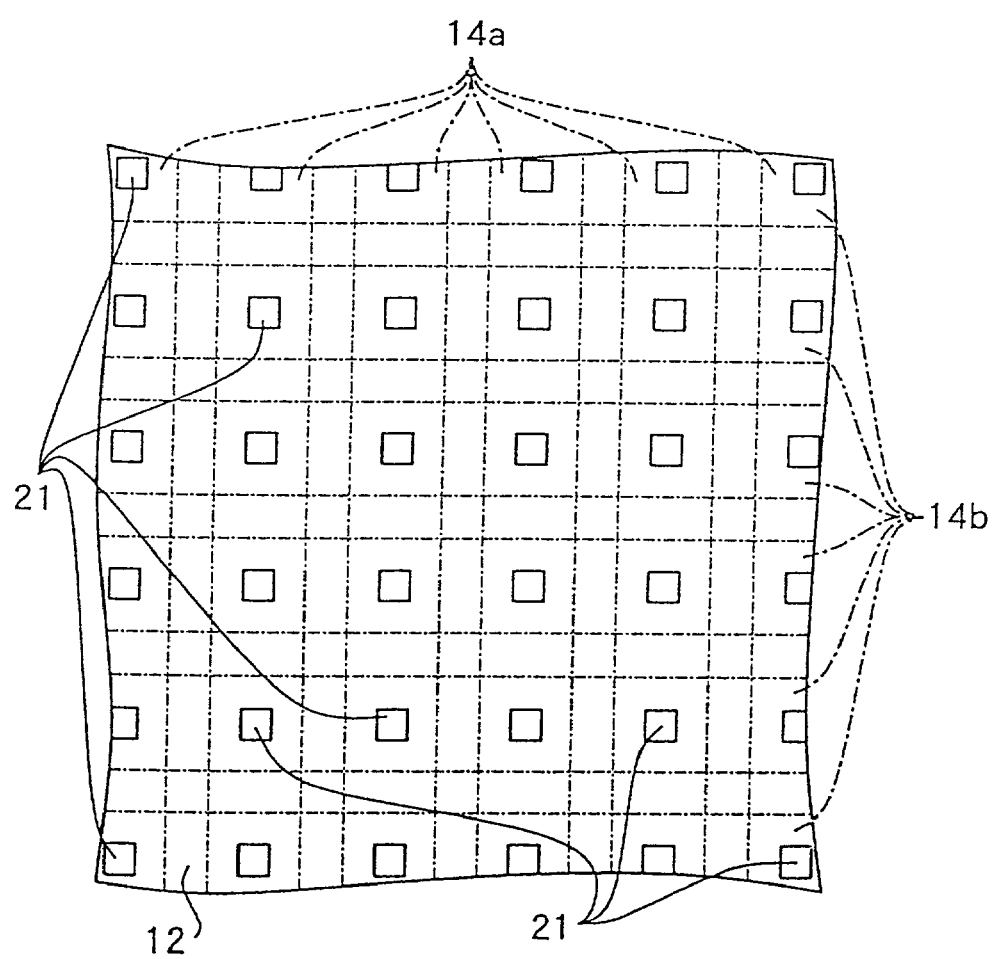

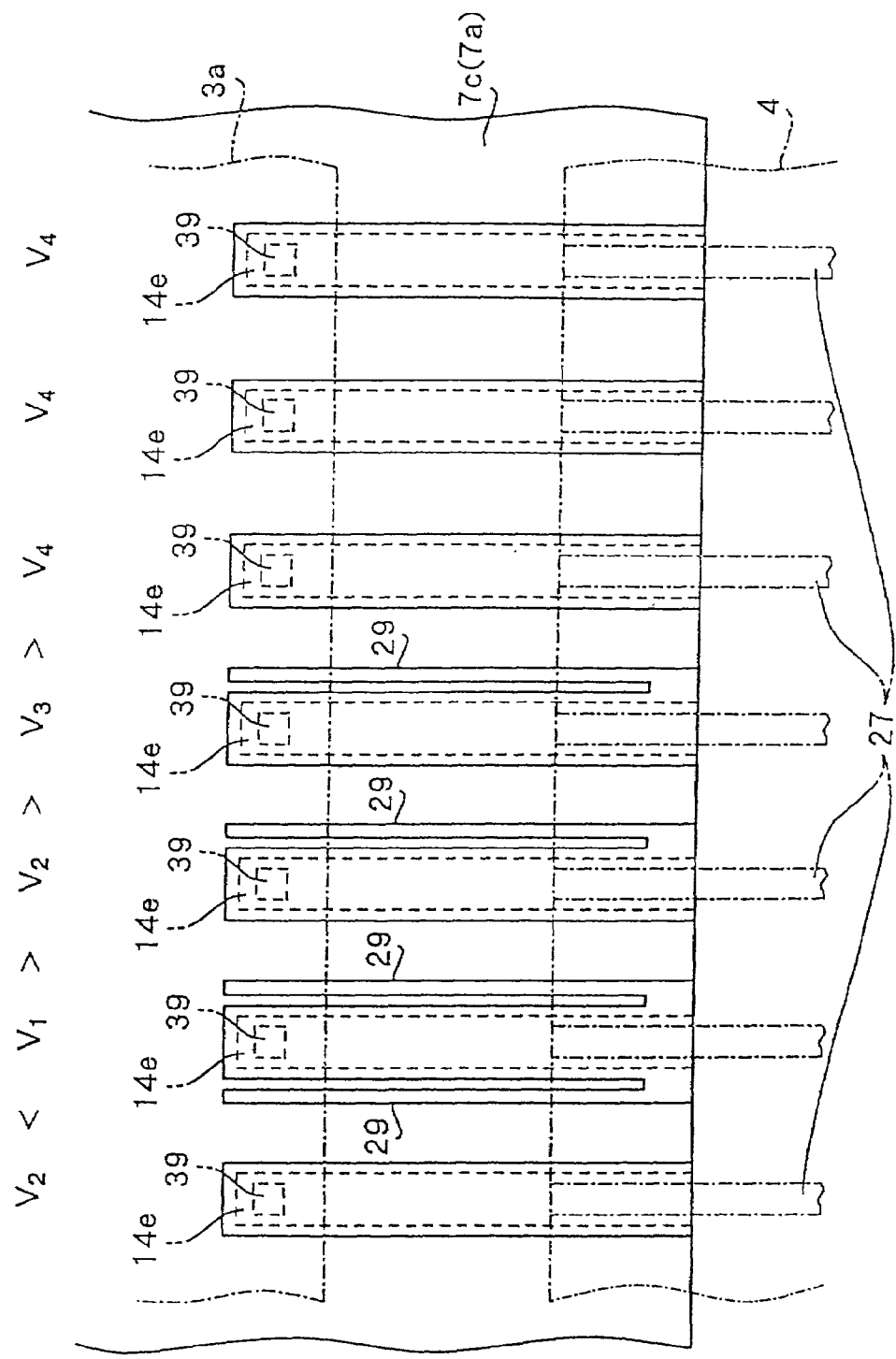
[FIG. 4]

[FIG. 5]
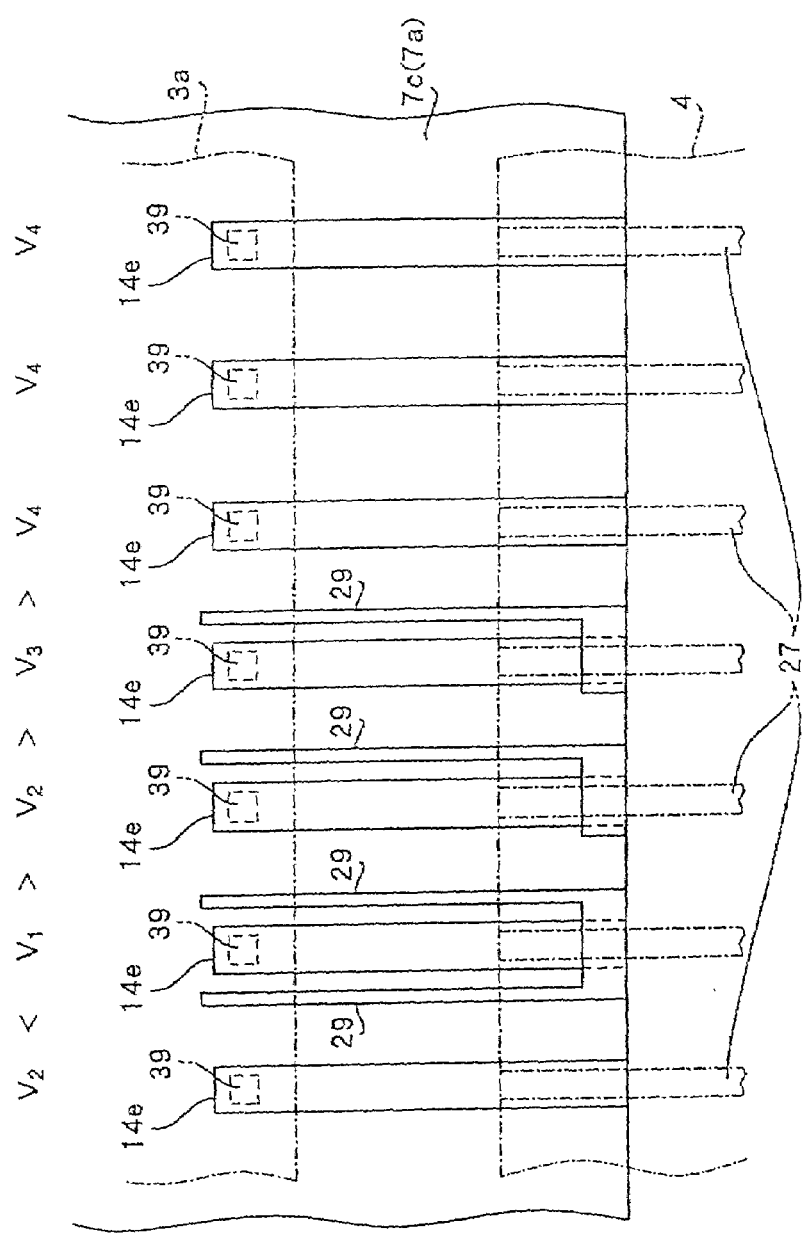

[FIG. 6]
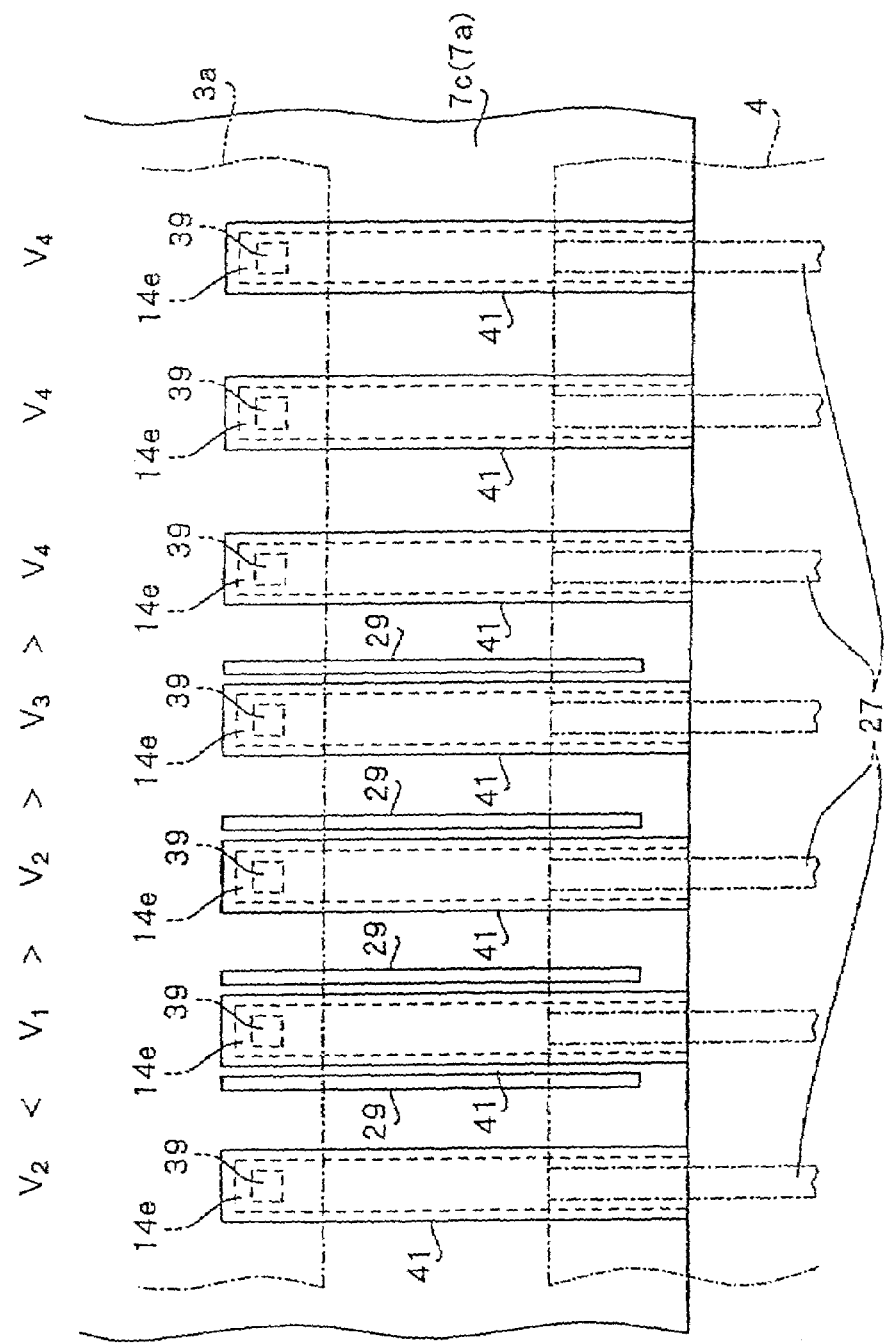

[FIG. 7]
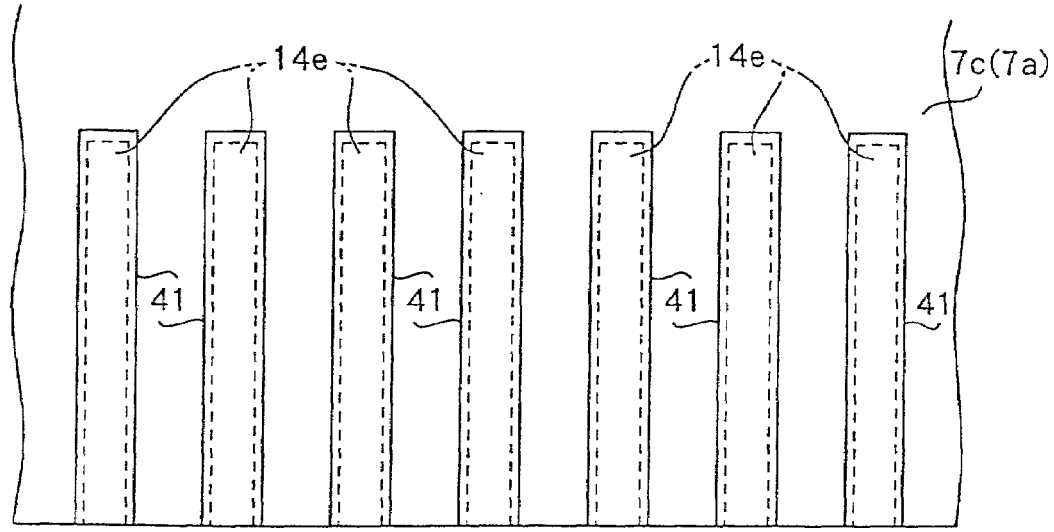
(a)
$V_2 < V_1 > V_2 > V_3 > V_4 \quad V_4 \quad V_4$
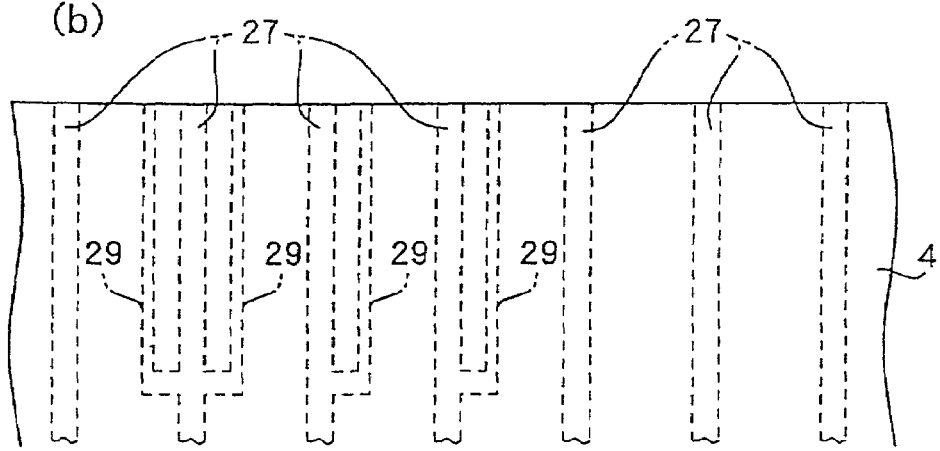
(b)
$V_2 < V_1 > V_2 > V_3 > V_4 \quad V_4 \quad V_4$

[FIG. 8]
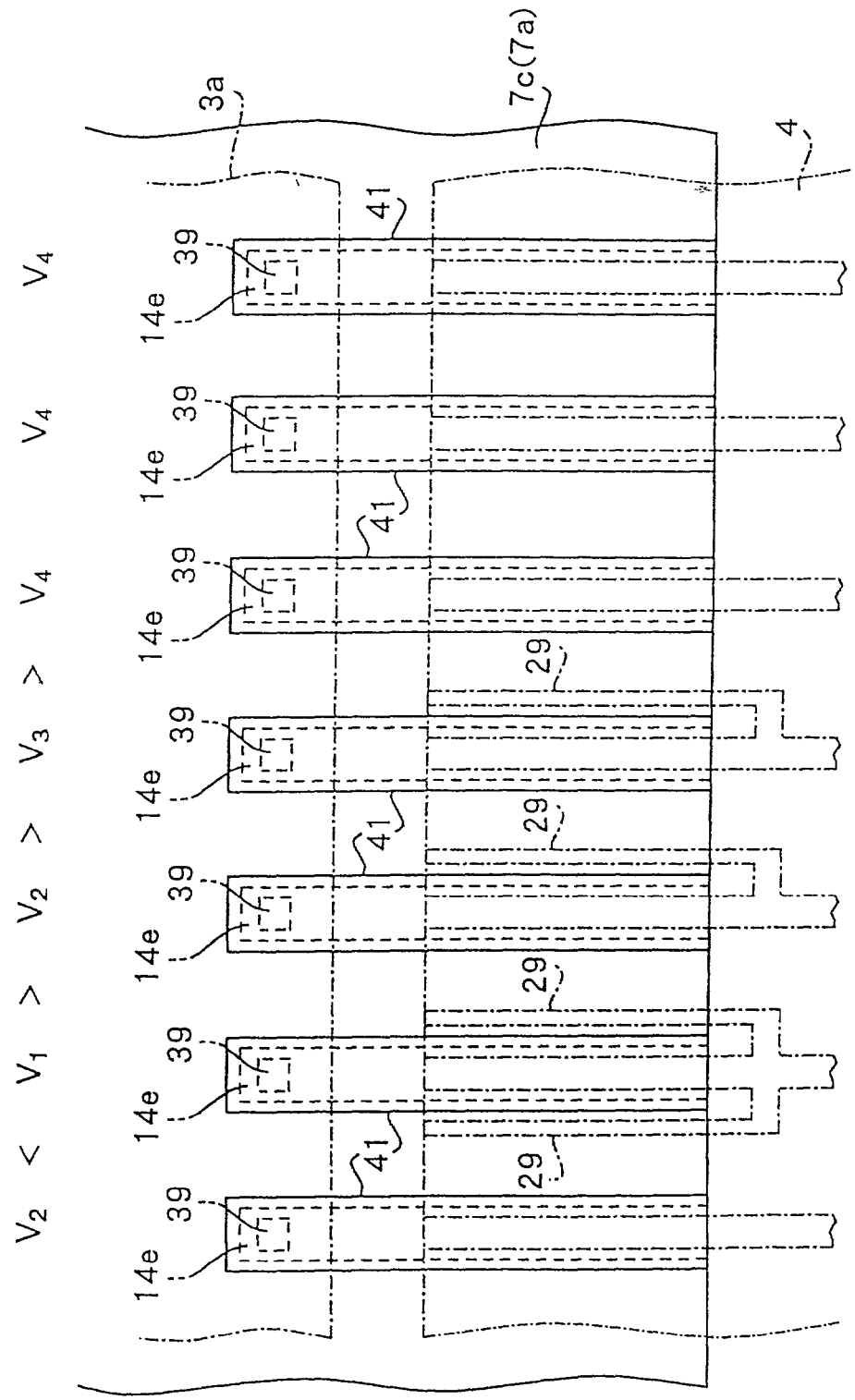

[FIG.9]
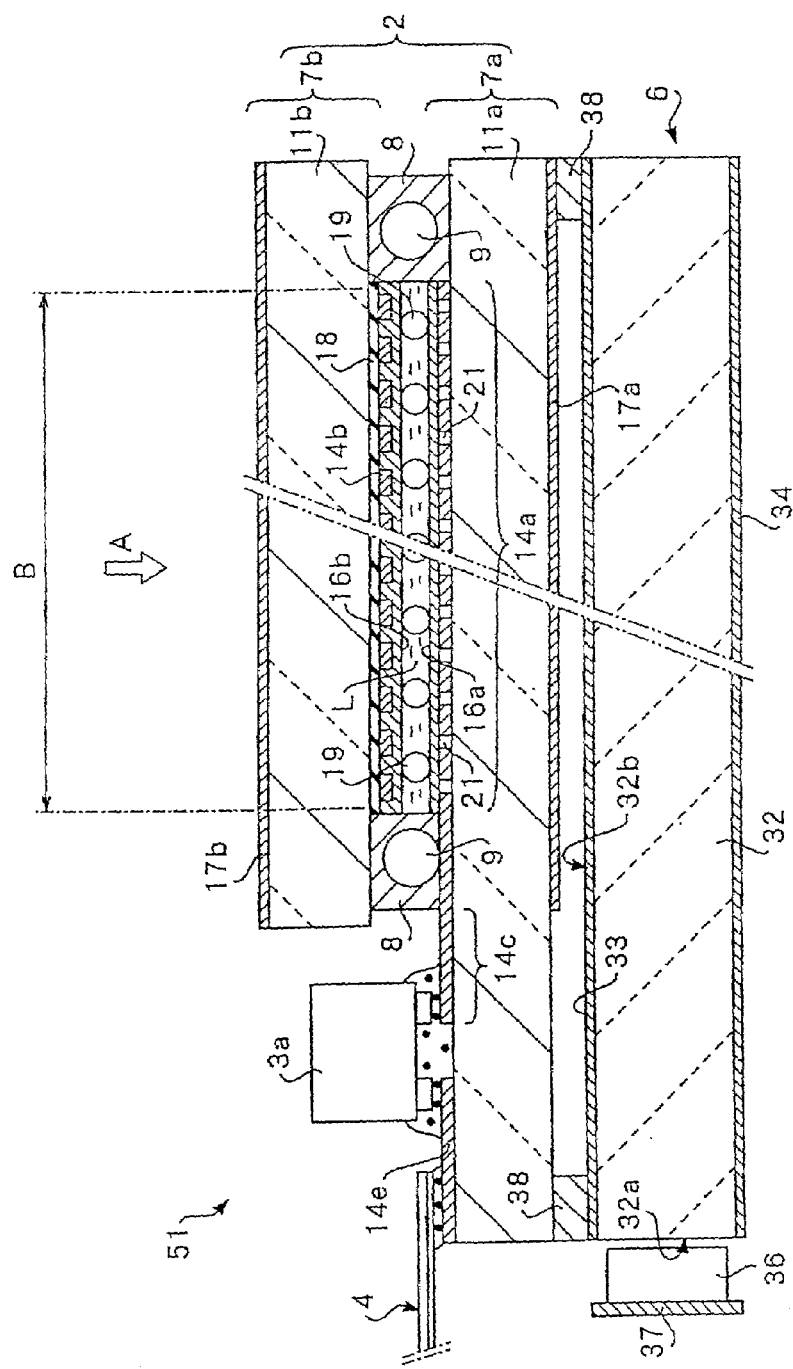

[FIG. 10]
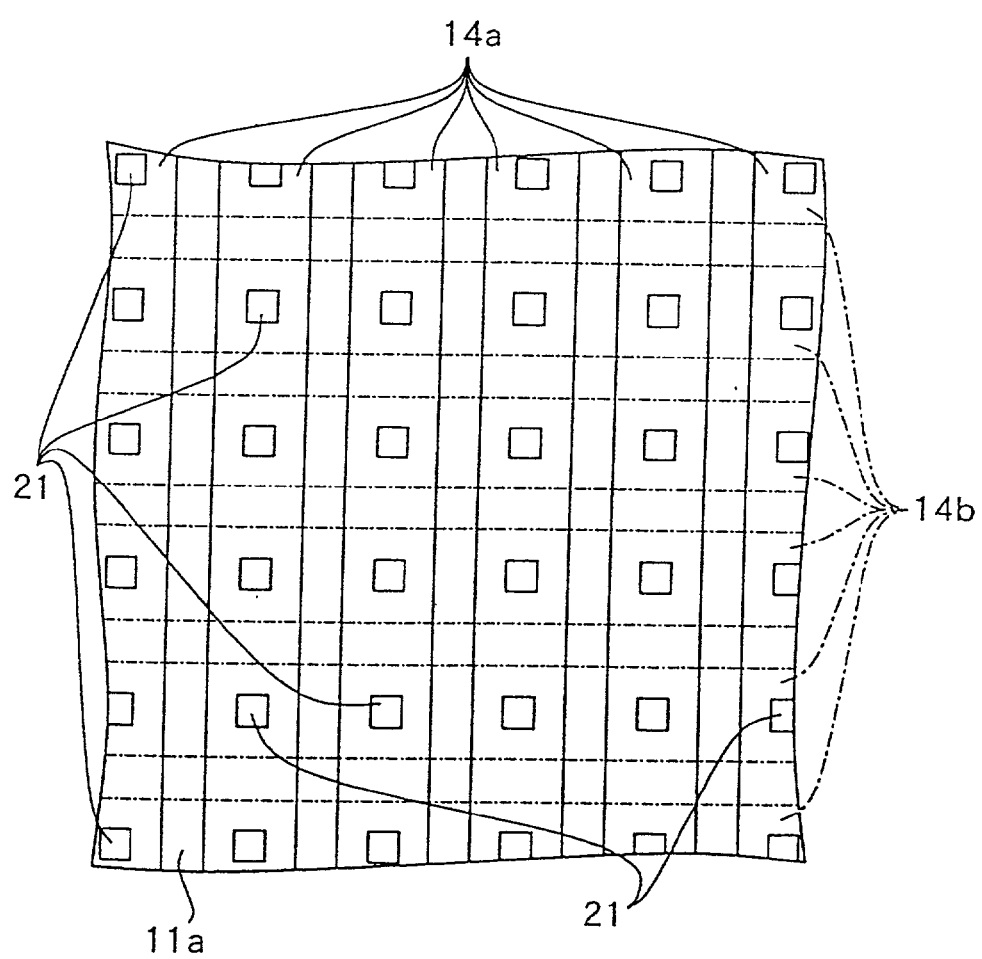

[FIG. 11]
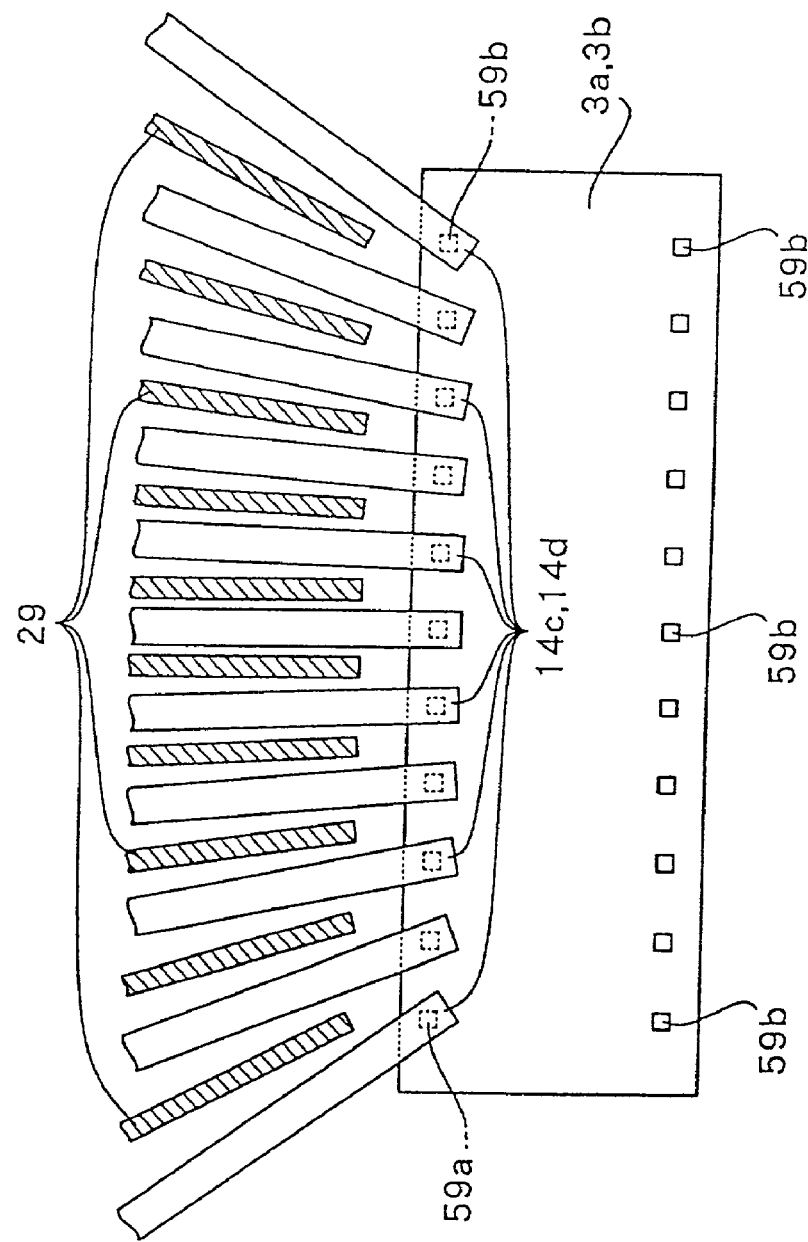

[FIG. 12]
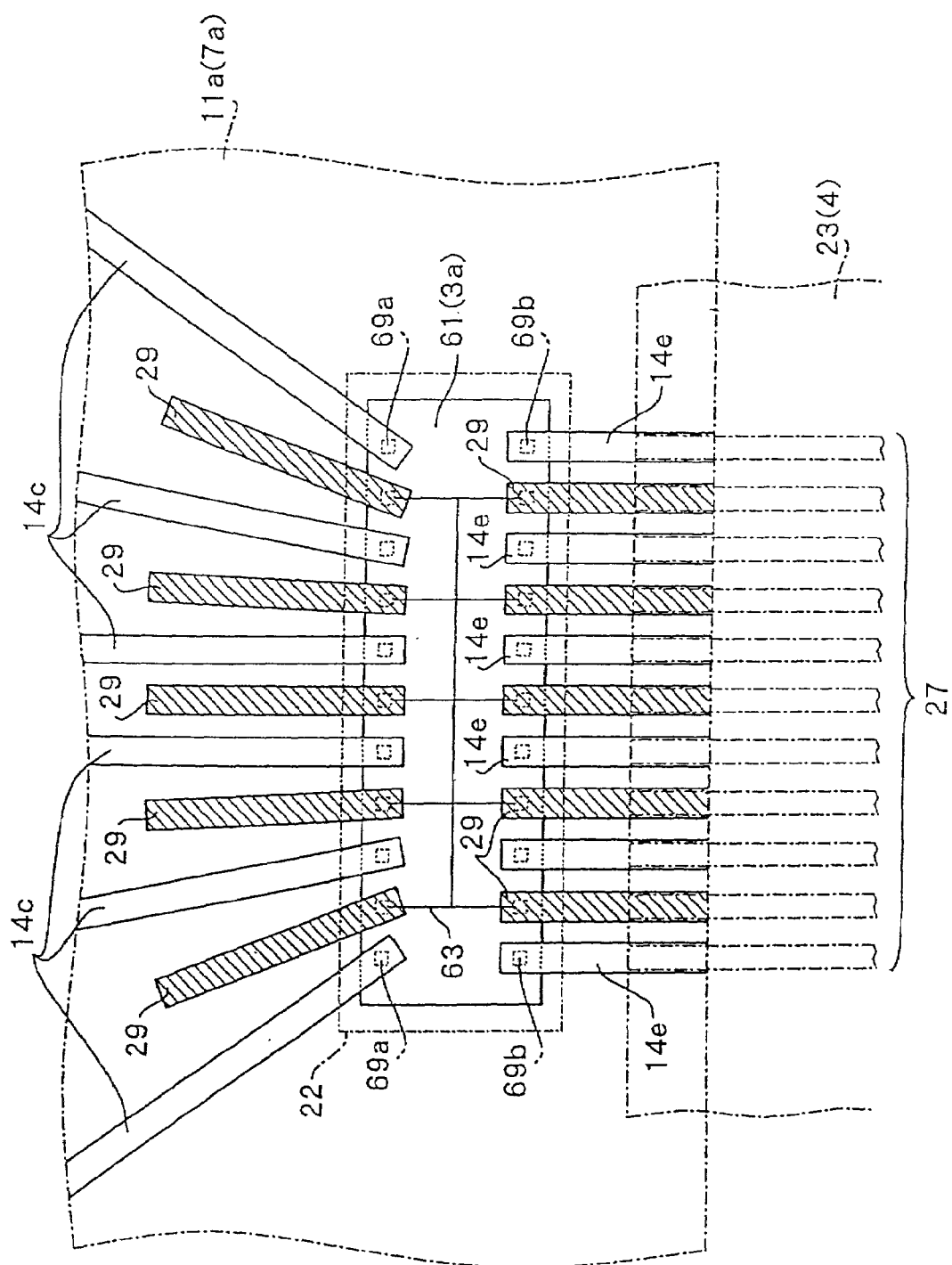

[FIG. 13]
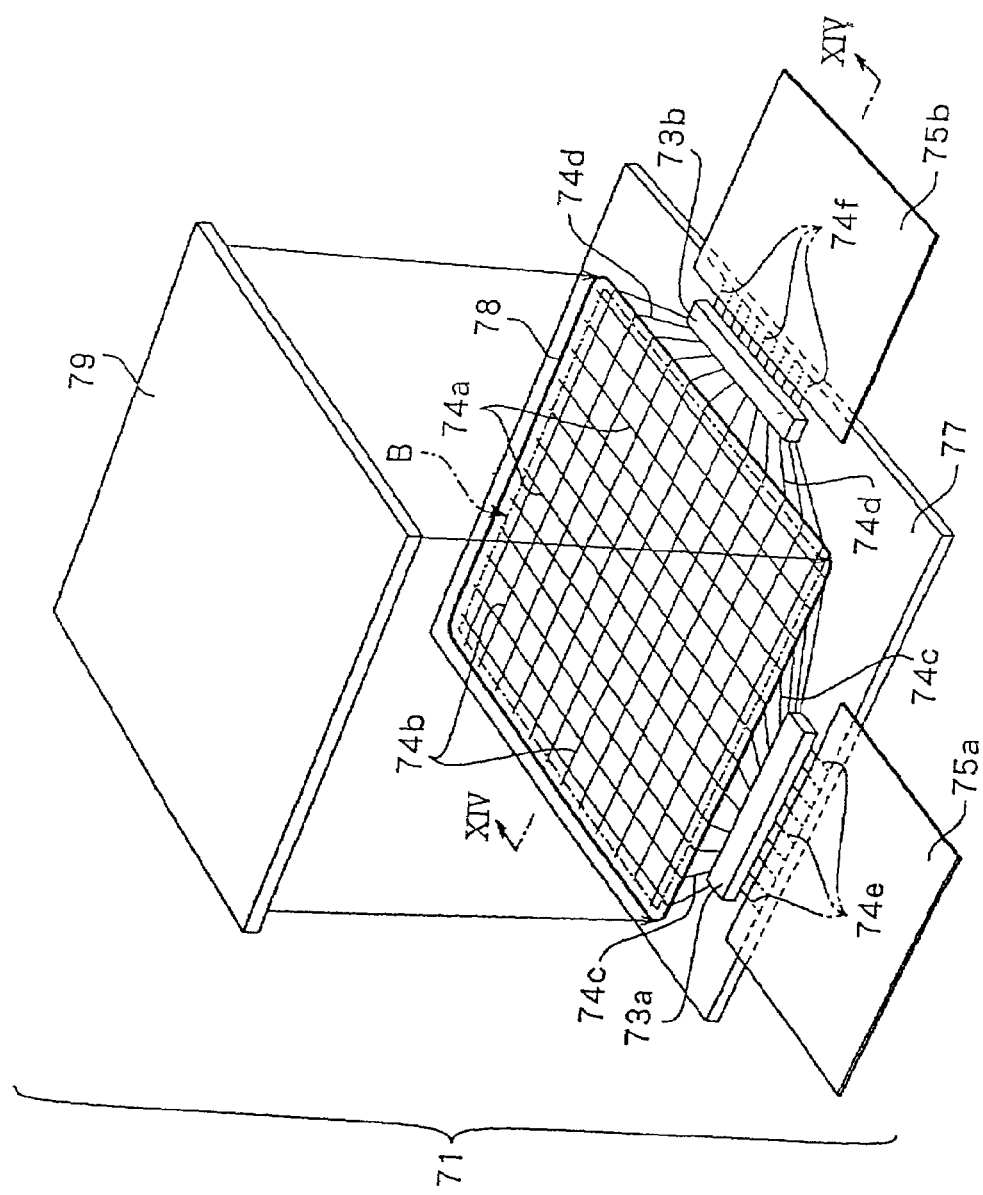

[FIG. 14]
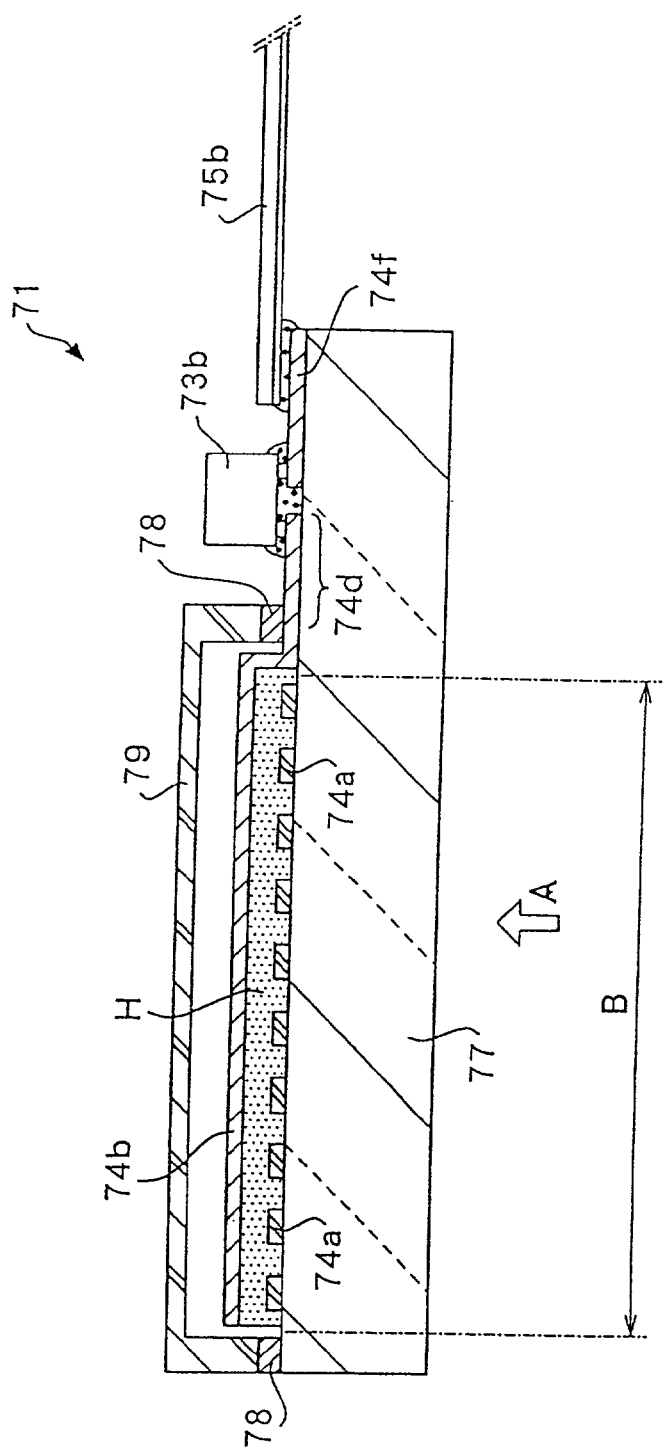

[FIG. 15]
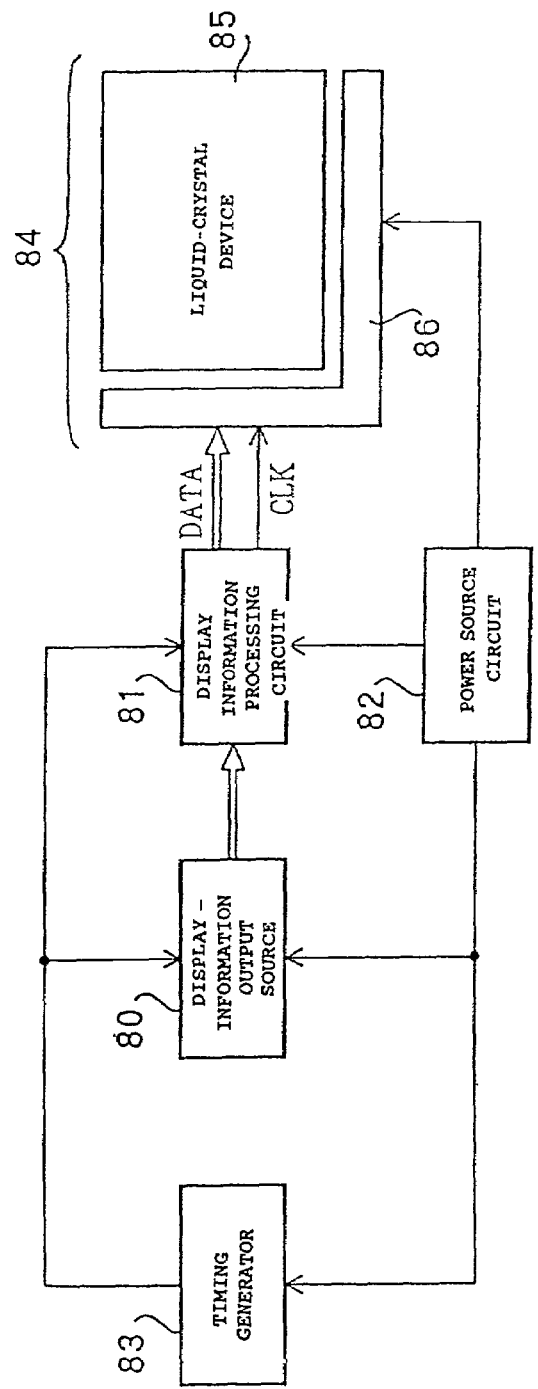

[FIG. 16]
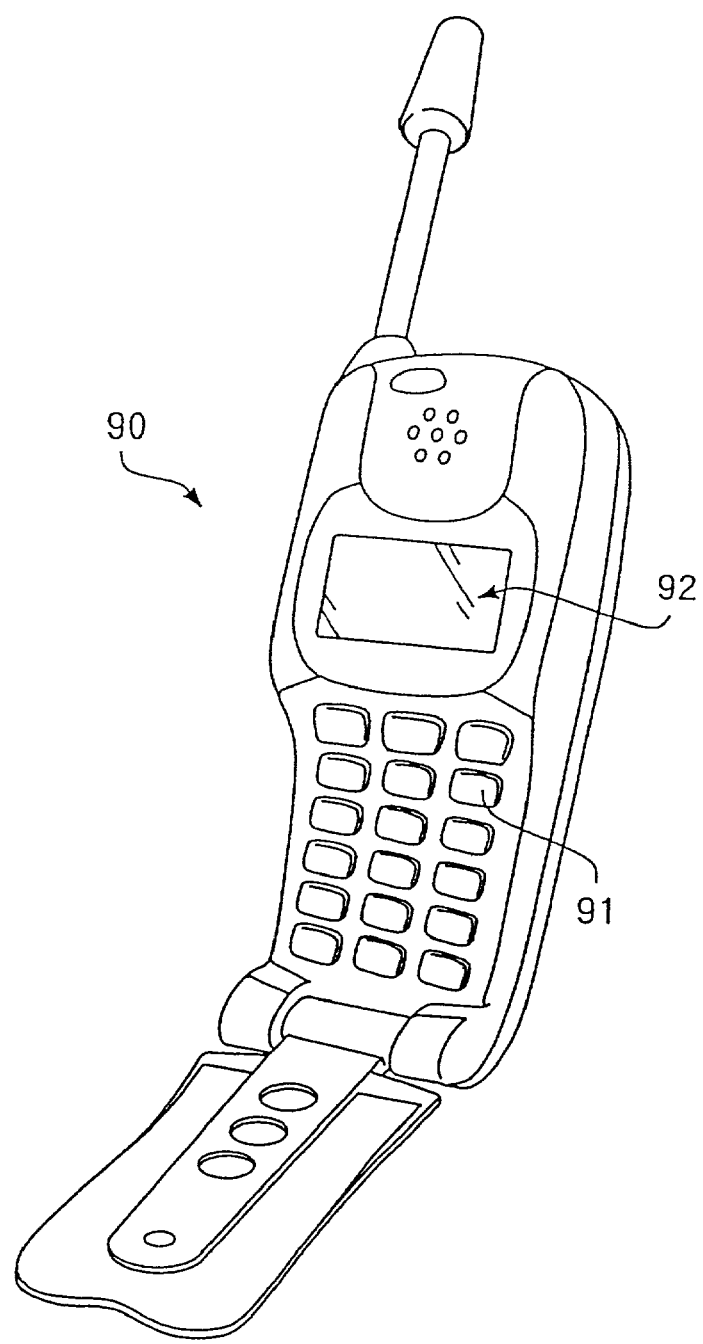

[FIG. 17]
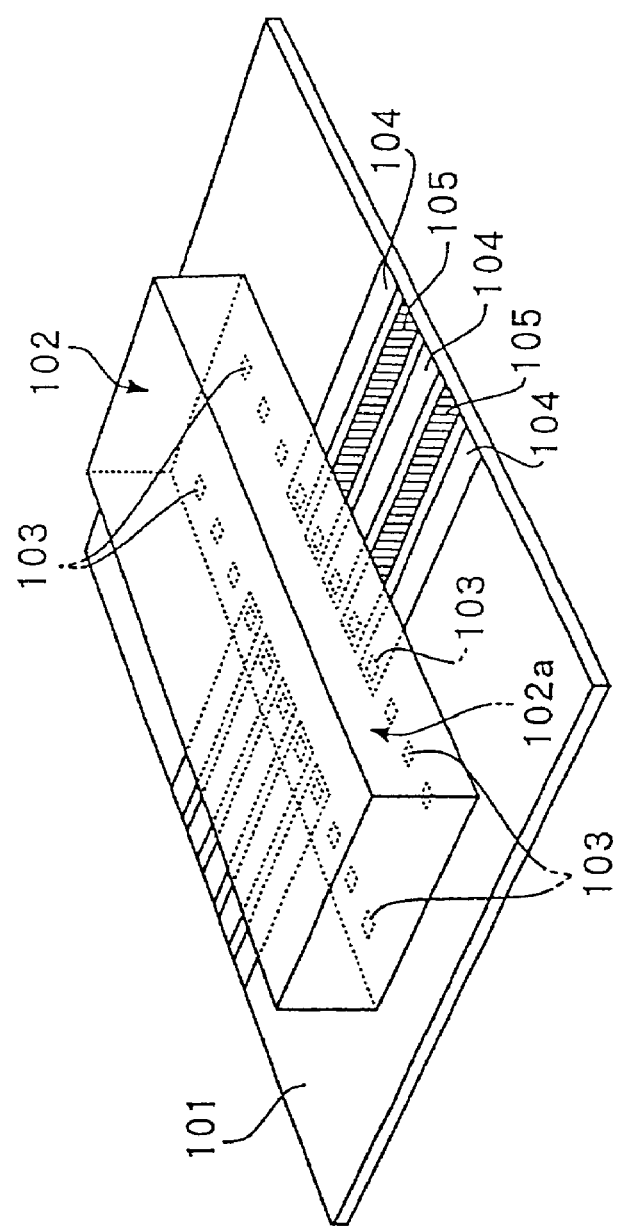

WIRING SUBSTRATE, DISPLAY DEVICE, SEMICONDUCTOR CHIP, AND ELECTRONIC EQUIPMENT

BACKGROUND OF THE INVENTION

1. Technical Field of the Invention

The present invention relates to a wiring substrate having a metal wiring formed on a substrate, a display device including the wiring substrate, a semiconductor chip for use in the wiring substrate, and electronic equipment employing one of the display device and the wiring substrate.

2. Description of the Related Art

A display device such as a liquid-crystal device is widely used as a display in electronic equipment such as a mobile computer, a mobile telephone, a video camera, etc. An EL (Electro-luminescence) device is beginning to be used as one of display units. The liquid-crystal device includes a pair of electrodes, and an electrooptical material interposed between the electrodes. By controlling a voltage applied between the electrodes, the orientation of the liquid crystal is controlled. When the orientation of the liquid crystal is controlled, light transmitted through the liquid crystal is modulated, thereby externally displaying an image of characters, numbers, etc.

The EL device sandwiches an EL light emission layer as an electrooptical device between a pair of electrodes, and controls a voltage applied between the electrodes, thereby controlling a current fed to the EL light emission layer. Light emission from the EL light emission layer is thus controlled, and an image of characters, numbers, etc. is externally displayed.

Each of the liquid-crystal device and the EL device is formed on a substrate that bears a single or a plurality of electrodes that sandwich the liquid crystal or the EL emission layer. In the liquid-crystal device, for example, a pair of substrates that are opposed to each other have electrodes respectively formed thereon. In the EL layer, on the other hand, a pair of electrodes sandwiching an EL emission layer are laminated on a single substrate. In these display devices, a plurality of electrodes are formed within an effective display area on the substrate, and extension wires leading from a plurality of electrodes and metal wirings different from the extension wires are arranged external to the effective display area. The electrodes formed within the effective display area may be fabricated of an oxide such as ITO, or a metal such as an APC alloy or Cr. When the electrode is formed of a metal, the extension wire leading from that electrode is also fabricated of a metal.

In a so-called COG (Chip On Glass) substrate, in which a semiconductor chip is directly mounted on a substrate, metal wirings, different from the extension wire outwardly leading from the effective display area, are input terminals of a semiconductor chip, such as a metal wiring connected to an input bump, and connected to an FPC (Flexible Printed Circuit) leading from an external circuit.

It is conventionally known that an electrically conductive oxide such as an ITO (an Indium Tin Oxide) is used as an electrode material formed on a substrate in the liquid-crystal device and the EL device. It is also known that a metal such as APC or Cr is used as a material of a metal wiring on a substrate. Here, APC refers to an alloy of Ag (silver), Pd (palladium), and Cu (copper).

Although the ITO has been widely used as a material for the electrode, it has a relatively high electrical resistance. Routing a long line of ITO trace on the substrate results in a high electrical resistance, making it impossible to normally operate a driving circuit. Low electrical resistance metal such as APC or Cr is considered as an effective means to resolve this problem. For example, the resistance of ITO is 15 □ per unit area, while the resistance of Cr is 1.5 Ω per unit area, and the resistance of APC is 0.1 Ω per unit area. Forming a wiring pattern on a substrate using such a low electrical resistance metal advantageously restricts electrical resistance of the pattern even if a long wiring pattern is routed on the substrate.

The use of a wiring pattern fabricated of APC or Cr on a substrate is effective in the reduction of electrical resistance. On the other hand, the APC or Cr wiring pattern is subject to corrosion and subsequent damage, and presents difficulty in maintaining the quality of wiring. The inventors of this invention have conducted various tests in an attempt to resolve the corrosion problem, and have reached the following conclusion. When a plurality of metal wirings are arranged side by side, a voltage difference occurs therebetween. In other words, the relationship of cathode and anode occurs between metal wirings, and the metal of the anode side, for example, Ag, dissolves.

In view of the above problem of the conventional wiring substrate, the present invention has been developed. It is an object of the present invention to prevent a metal wiring from being corroded even when a wiring pattern is fabricated of a low electrical resistance metal.

SUMMARY OF THE INVENTION (1) To achieve the above object, a first wiring substrate, having a plurality of metal wirings on a substrate, includes a guard wiring fabricated of an electrically conductive oxide and arranged between at least a pair of mutually adjacent metal wirings out of the plurality of metal wirings. Each guard wiring may be arranged between every two metal wirings or between two required metal wirings.

In the wiring substrate having this arrangement, the guard wiring fabricated of an electrically conductive oxide is arranged between adjacent metal wirings. When a voltage difference occurs between the adjacent metal wirings, corrosion of the metal wiring working as an anode is prevented from dissolving even in the relationship of a cathode and anode setting which occurs in the adjacent metal wirings. In this way, electrical performance of the wiring substrate is maintained at a desired level for a long period of time.

(2) A second wiring substrate of the present invention having a pair of wiring substrate elements connected to each other, includes a plurality of metal wirings formed on one of the pair of wiring substrate elements, and at least one guard wiring fabricated of an electrically conductive oxide and arranged on the other of the pair of wiring substrate elements, wherein the pair of substrate elements are connected in a manner such that the guard wiring is interposed between the plurality of metal wirings.

Contemplated as the wiring substrate element are a glass substrate having a wiring pattern formed thereon, an FPC (Flexible Printed Circuit) having a wiring pattern thereon, or a TAP (Tape Automated Bonding) substrate having a wiring pattern formed thereon and a semiconductor chip mounted thereon. The second wiring substrate is assembled by connecting at least two wiring substrate elements. A connection method may be selected from a diversity of methods such as a method using an ACF (Anisotropic Conductive Film) in which a number of electrically conductive particles are dispersed in a resin, or a soldering method.

In the second wiring substrate, the guard wiring fabricated of an electrically conductive oxide is arranged between adjacent metal wirings with at least the two wiring substrate elements connected to each other. When a voltage difference occurs between the adjacent metal wirings, the metal wiring functioning as an anode is prevented from being corroded in the relationship of cathode and anode. In this way, electrical performance of the wiring substrate is maintained at a desired level for a long period of time.

In the first wiring substrate and the second wiring substrate, the guard wiring may be fixed to a voltage or may be left floating. To feed voltage to the guard wiring, it is preferable to connect the guard wiring to the anode side metal wiring of the pair of adjacent metal wirings. The voltage of the guard wiring is thus set to be equal to the anode metal wiring. In this arrangement, the guard wiring fabricated of the electrically conductive oxide works as an anode with respect to the cathode metal wiring, and the anode metal wiring is reliably prevented from being corroded.

In the first wiring substrate and the second wiring substrate, the electrically conductive oxide layer fabricated of the same material as that of the guard wiring is preferably laminated on the entire surface or a portion of the surface of the metal wiring. In this arrangement, the metal wiring is reliably protected from corrosion.

In the first wiring substrate and the second wiring substrate, the metal wiring is fabricated of at least a metal selected from or an alloy containing at least one selected from the group consisting of Au, Ag, Pd, Cu, Cr, Al, Nd, and Ti. Specifically, the metal wiring may be fabricated of an APC alloy containing 98% Ag, 1% Pd, and 1% Cu, or a metal mainly fabricated of Cr, or other metal. In the liquid-crystal device and the EL device, the metal wiring may serve as an electrode for electrically controlling the electrooptical material such as a liquid crystal or an EL light emission layer, or may serve as a reflective layer for reflecting light.

In the first wiring substrate and the second wiring substrate, the electrically conductive oxide forming the guard wiring includes one of an ITO and tin oxide.

(3) A third wiring substrate of the present invention having a plurality of metal wirings formed on a substrate, and a semiconductor chip mounted on the substrate, includes a guard wiring fabricated of an electrically conductive oxide and arranged between at least a pair of metal wirings out of the plurality of metal wirings, wherein the guard wiring is connected to a high-voltage terminal of the semiconductor chip, and the metal wiring adjacent to the guard wiring is connected a low-voltage terminal of the semiconductor chip.

Referring to FIG. 17, the third wiring substrate bears a semiconductor chip 102 mounted on the surface of a substrate 101. The semiconductor chip 102 typically has a number of terminals 103 on the active surface 102a thereof, such as metal bumps to establish electrical connection with an external circuit. The wiring substrate of this invention includes a guard wiring 105 between at least a pair of plurality of metal wirings 105 formed on the substrate 101. A terminal 103 of the semiconductor chip 102 connected to a metal wiring 104 is set to be a high voltage while a terminal 103 connected to the guard wiring 105 is set to be a low voltage. This arrangement prevents the anode side terminal and the cathode side terminal from being adjacent to each other. The metal wiring 104 is prevented from being corroded.

(4) A display device of the present invention includes a plurality of first electrodes, a plurality of second electrodes facing the plurality first electrode within an effective display area, an electrooptical material interposed between the first electrodes and the second electrodes, and a plurality of metal wirings arranged external to the effective display area, wherein a guard wiring, fabricated of an electrically conductive oxide, is arranged in one of a region between at least a pair of adjacent metal wirings out of the plurality of metal wirings and/or a region between at least a pair of adjacent electrodes out of the plurality of electrodes.

Specifically, the display device may be constructed as a liquid-crystal device or an EL device. When the display device is constructed as a liquid-crystal device, the electrooptical substance may be a liquid crystal. The plurality of first electrodes and second electrodes are respectively formed on the surfaces of a pair of substrates facing each other with the liquid crystal interposed therebetween, and at least one of the pair of substrates includes a substrate extension portion extending from the area of the other of the pair of substrates, and the metal wiring is formed on the substrate extension portion.

When the display device is an EL device, the electrooptical material includes an EL light emission layer that emits light in response to an applied voltage. The plurality of first electrodes, the EL light emission layer interposed between the first electrodes and the second electrodes, and the second electrodes are successively laminated on a common substrate, and the metal wiring is arranged on the substrate, external to the effective display area.

The guard wiring is interposed between the metal wirings in areas external to and/or internal to the effective display area. When a voltage difference occurs between adjacent metal electrodes causing the relationship of cathode and anode, or when a voltage difference occurs between adjacent metal electrodes causing the relationship of cathode and anode, the anode metal wiring or the anode metal electrode is prevented from being corroded. In this way, electrical performance of the substrate forming the display device is maintained at a desired level for a long period of time. Also, excellent image quality is maintained for a long period of time.

The guard wiring is preferably connected to an anode side of the pair of metal wirings and/or an anode side of the pair of electrodes. In this arrangement, the potential of the anode metal wiring or the anode metal electrode is set to the same level as the adjacent guard wiring. The guard wiring fabricated of an electrical conductive oxide serves as an anode with respect to the cathode metal wiring or the cathode metal electrode. The anode metal wiring and the anode metal electrode are reliably prevented from being corroded.

In the above-referenced display device, the electrically conductive oxide layer fabricated of the same material as that of the guard wiring is laminated on the entire surface or a portion of the surface of the metal wiring and/or on the entire surface or a portion of the surface of the electrode. In this way, the metal wiring and the metal electrode are prevented from being corroded.

In the above-referenced display device, one of the metal wiring and the electrode is fabricated of at least a metal selected from or an alloy containing at least one selected from the group consisting of Au, Ag, Pd, Cu, Cr, Al, Nd, and Ti. Specifically, the metal wiring may be fabricated of an APC alloy containing 98% Ag, 1% Pd, and 1% Cu, or a metal mainly fabricated of Cr, or other metal. In the display device such as the liquid-crystal device and the EL device, the metal wiring may serve as an electrode for electrically controlling the electrooptical material such as a liquid crystal or an EL light emission layer, or may serve as a reflective layer for reflecting light.

In the above-referenced display device, the electrically conductive oxide that forms guard wiring may include one of an ITO and tin oxide.

(5) In a semiconductor chip of the present invention, having an internal circuit and a plurality of externally exposed terminals such as bumps, the plurality of terminals alternate between a low-voltage terminal and a high-voltage terminal.

The semiconductor chip typically includes a plurality of metal bumps on the active surface thereof. The metal wirings formed on the glass substrate or plastic substrate are connected to these terminals. If a low voltage terminal and a high voltage terminal are alternately arranged in the layout of the terminals of the semiconductor chip, the guard wiring fabricated of the electrically conductive oxide layer is connected to the high voltage terminal, while the metal wiring fabricated of an APC alloy is connected to the low voltage terminal. In this way, the metal wiring and the oxide guard wiring are alternately arranged. The metal wiring is set to be a high voltage while the oxide guard wiring is set to be a low voltage.

Since the guard wiring fabricated of an electrically conductive oxide is arranged between adjacent metal wirings on the substrate, the anode metal wiring is prevented from being corroded even if a voltage difference occurs between the adjacent metal wirings in the relationship of cathode and anode. In this way, the image of quality of the display device is maintained for a long period of time.

In the above-referenced semiconductor chip, a metal wiring is connected to the low-voltage terminal, and a guard wiring fabricated of electrically conductive oxide is connected to the high-voltage terminal. The guard wiring may be a dummy wiring with no signal coupled thereto.

(6) Electronic equipment of the present invention includes a display device for presenting an image thereon, and a wiring substrate which is arranged internally to and/or externally to a display device. The wiring substrate includes a plurality of metal wirings thereon, and a guard wiring, fabricated of an electrically conductive oxide, is arranged between at least a pair of adjacent metal wirings out of the plurality of metal wirings. Such electronic equipment may be a mobile telephone, a mobile computer, or a video camera.

Since the guard wiring fabricated of the electrically conductive oxide is interposed between adjacent metal wirings in the built-in wiring substrate, the anode metal wiring is prevented from being corroded in the relationship of cathode and anode even when a voltage difference occurs between adjacent metal wirings. In this way, electrical performance of the substrate forming the display device is maintained at a desired level for a long period of time. Also, excellent image quality is maintained for a long period of time.

BRIEF DESCRIPTION OF THE DRAWINGS

FIG. 1 is an exploded perspective view showing a liquid-crystal device as one example of the display device incorporating a wiring substrate of the present invention.

FIG. 2 is a sectional view of the liquid-crystal device taken along line II—II in FIG. 1.

FIG. 3 is a plan view partly showing a reflective layer incorporated in the liquid-crystal device of FIG. 2.

FIG. 4 is a plan view showing one embodiment of the wiring substrate of the present invention used in the liquid-crystal device of FIG. 1.

FIG. 5 is a plan view showing another embodiment of the wiring substrate of the present invention.

FIG. 6 is a plan view showing yet another embodiment of the wiring substrate of the present invention.

FIG. 7 is a plan view of yet another embodiment of the wiring substrate of the present invention, showing separately a pair of wiring substrate elements.

FIG. 8 is a plan view of the pair of wiring substrate elements of FIG. 7, which are mated to each other.

FIG. 9 is a sectional view of another embodiment of the liquid-crystal device as one example of the display device incorporating the wiring substrate of the present invention.

FIG. 10 is a plan view partly showing electrodes that function as a reflective layer in the liquid-crystal device of FIG. 9.

FIG. 11 is a plan view showing another embodiment of the wiring substrate of the present invention.

FIG. 12 is a plan view showing one embodiment of a semiconductor chip and a wiring substrate of the present invention.

FIG. 13 is an exploded perspective view showing one embodiment of an EL device as one example of the display device incorporating the wiring substrate of the present invention.

FIG. 14 is a sectional view of the EL device taken along line XIV—XIV in FIG. 13.

FIG. 15 is a block diagram showing one embodiment of electronic equipment of the present invention.

FIG. 16 is a perspective view showing another embodiment of the electronic equipment of the present invention.

FIG. 17 is a perspective view of one embodiment of the wiring substrate of the present invention.

DETAILED DESCRIPTION OF THE PREFERRED EMBODIMENTS

FIG. 1 shows one embodiment of a liquid-crystal device as one example of the display device of the present invention. Liquid-crystal devices may be divided into a passive matrix liquid crystal device and an active matrix liquid crystal device in terms of drive method. The one shown in FIG. 1 is a passive-matrix liquid-crystal device. According to light supply method, the liquid-crystal devices may be divided into a reflective type, transmissive type, and a transflective type. The one shown in FIG. 1 is a transflective type.

The reflective type liquid-crystal device reflects external light such as sunlight or ambient light from the rear surface of a liquid crystal and uses the reflected light as a light source. The transmissive type liquid-crystal device employs light from a cold cathode tube or an LED (Light Emitting Diode) as a light source, and allows light therefrom to transmit through a liquid crystal. The transflective type liquid-crystal device presents a display in a reflective mode when sufficiently strong external light is available, while presenting a display in a transmissive mode when external light is not sufficiently strong.

The liquid-crystal displays may be divided into a monochrome type or a full-color type in terms of color display. The one shown in FIG. 1 is a full-color liquid-crystal device. The liquid-crystal device shown in FIG. 1 is therefore a passive-matrix, transflective, full-color liquid-crystal display.

Referring to FIG. 1, the liquid-crystal device 1 has liquid-crystal driving ICs 3a and 3b mounted on a liquid-crystal panel 2. An FPC (Flexible Printed Circuit) 4 as a wiring connection element is connected to the liquid-crystal panel 2. An illumination unit 6 is attached on the rear side of the liquid-crystal panel 2.

The liquid-crystal panel 2 is constructed by bonding a first substrate 7a and a second substrate 7b to each other using a sealing member 8. The sealing member 8 is formed by allowing an epoxy based resin to extend in a ring on the inner surface of each of the first substrate 7a and the second substrate 7b. Referring to FIG. 2, the sealing member 8 includes dispersed, electrically conductive members 9 having a spherical shape or a cylindrical shape.

As shown in FIG. 2, the first substrate 7a includes planar base member 11a formed of transparent glass or transparent plastic. A reflective layer 12 is formed on the inner surface of the base member 11a (the top surface of the base member 11a in FIG. 2), an insulator layer 13 is laminated on the reflective layer 12, and first electrodes 14a (see FIG. 1) are formed on the insulator layer 13 in stripes if viewed from an arrow A in FIG. 2. Furthermore, an alignment layer 16a is formed on the first electrode 14a. A polarizer 17a is glued on the external surface of the base member 11a (the bottom surface of the base member 11a in FIG. 2).

Referring to FIG. 1, for clarity, the first electrodes 14a are drawn with the spacing therebetween wider than an actual spacing and the number of first electrodes 14a is smaller than the actual number thereof. In practice, a large number of first electrodes 14a are arranged on the base member 11a.

Referring to FIG. 2, the second substrate 7b includes a base member 11b fabricated of transparent glass or transparent plastic. A color filter 18 is formed on the inner surface of the base member 11b (the underside of the base member 11b in FIG. 2). Second electrodes 14b, arranged on the color filter 18, extend in stripes, if viewed from the arrow A, in a direction perpendicular to the first electrodes 14a (as shown in FIG. 1). An alignment layer 16b is formed on the second electrodes 14b. A polarizer 17b is glued on the external surface of the base member 11b (the top side of the base member 11b in FIG. 2).

Referring to FIG. 1, for clarity, the second electrodes 14b are drawn with the spacing therebetween wider than the actual spacing thereof and the number of the second electrodes 14b is smaller than the actual number thereof. In practice, a large number of first electrodes 14b are arranged on the base member 11b.

Referring to FIG. 2, the gap, enclosed by the first substrate 7a, the second substrate 7b, and the sealing member 8, i.e., the cell gap, is filled with a liquid crystal L, such as an STN (Super Twisted Nematic) liquid crystal L. A large number of small spherical spacers 19 are dispersed within the region between the first substrate 7a and the second substrate 7b. The presence of these spacers 19 keeps the thickness of the cell gap constant.

The first electrodes 14a and the second electrodes 14b are arranged mutually perpendicular to each other, thereby forming intersections thereof in a matrix. An intersection at each point of matrix constitutes a pixel. In the color filter 18, R (red), G (green), and B (blue) color elements are arranged in a predetermined pattern such as a stripe configuration, a delta configuration, or a mosaic configuration, if viewed from the arrow A. The single color element corresponds to each of R, G, and B dots, and the three R, G, and B color elements correspond to a single pixel.

By selectively turning on a plurality of color elements, thereby pixels, arranged in a matrix, characters and numbers are presented on the second substrate 7b of the liquid-crystal panel 2. An area where an image is presented is an effective pixel area. A planar rectangular area indicated by an arrow B in FIG. 1 and FIG. 2 is the effective display area.

Referring to FIG. 2, the reflective layer 12 is fabricated of a light reflective material such as an APC alloy or aluminum (Al). Referring to a plan view in FIG. 3, an aperture 21 is opened corresponding to a color element where one first electrode 14a intersects one second electrode 14b. The apertures 21 are thus formed in a dot matrix, if viewed from the arrow A, in the same manner as the color element.

The first electrodes 14a and the second electrodes 14b are fabricated of an ITO, which is an electrically conductive, transparent material. The alignment layers 16a and 16b are formed by applying a polyimide based resin to a uniform thickness. When the alignment layers 16a and 16b are subjected to a rubbing process, the initial orientation of liquid crystal molecules are determined on the first substrate 7a and the second substrate 7b.

Referring to FIG. 1, the first substrate 7a is wider in area than the second substrate 7b. When they are bonded using the sealing member 8, the first substrate 7a has a substrate extension portion 7c outwardly projecting out of the formation area of the second substrate 7b. A substrate extension area 7c bears extension lines 14c leading from the first electrodes 14a, extension lines 14d connected to the second electrodes 14b on the second substrate 7b through conductor members 9 (see FIG. 2) present within the sealing member 8, input bumps for the liquid-crystal driving IC 3a, namely, metal wirings 14d connected to the input terminals, and metal wirings 14f connected input bumps of the liquid-crystal driving IC 3b.

In this embodiment, the extension lines 14c leading from the first electrodes 14a and the extension lines 14d leading to the second electrodes 14b are fabricated of ITO, which is the same material as that for the electrode, namely, the electrically conductive oxide. The metal wirings 14e and 14f on the input side of the liquid-crystal driving ICs 3a and 3b are fabricated of a low electrical resistance metal, such as the APC alloy. The APC alloy mainly contains Ag, and smaller contents of Pd and Cu. For example, the APC alloy contains 98% Ag, 1% PD, and 1% Cu. Instead of the APC alloy, Au, Cr, Al, Nd, or Ti may be used for the metal wirings 14e and 14f.

The liquid-crystal driving IC 3a and the liquid-crystal driving IC 3b are mounted on the surface of the substrate extension area 7c using an ACF (Anisotropic Conductive Film) 22. This embodiment employs a so-called COG (Chip On Glass) liquid-crystal panel, in which a semiconductor chip is directly mounted on the substrate. In the COG structure, electrically conductive particles contained in the ACF 22 electrically connect the input bumps of the liquid-crystal driving IC 3a and the liquid-crystal driving IC 3b to the metal wirings 14e and 14f, and the output bumps of the liquid-crystal driving IC 3a and the liquid-crystal driving IC 3b to the extension lines 14c and 14d.

Referring to FIG. 1, the FPC 4 includes a circuit 26 including a flexible resin film 23 and chip components 24, and metal wiring terminals 27. The circuit 26 is directly mounted on the surface of the resin film 23 using an electrical connection method such as a soldering technique.

The metal wiring terminals 27 are fabricated of an APC alloy, Cr, Cu, or other electrically conductive material. The metal wiring terminals 27 of the FPC 4 are respectively connected to the metal wirings 14e and 14f of the first substrate 7a through the ACF 22. The electrically conductive particles contained in the ACF 22 respectively electrically connect the metal wirings 14e and 14f of the substrate to the metal wiring terminals 27 of the FPC.

External connection terminals 31, arranged on the opposed edge of the FPC 4, are connected to an unshown external circuit. Signals from the external circuit drive the liquid-crystal driving ICs 3a and 3b so that one of the first electrode 14a and the second electrode 14b is supplied with a scanning signal, and so that the other of the first electrode 14a and the second electrode 14b is supplied with a data signal.

A dot matrix of color elements arranged in the effective display area B are thus voltage controlled on a pixel by pixel basis. As a result, the orientation of the liquid crystal L is controlled on a pixel by pixel basis.

Referring to FIG. 1, the illumination unit 6, functioning as a back light, includes a light guide body 32 of acrylic resin, a diffusion sheet 33 arranged on a light exit surface 32b of the light guide body 32, a reflective sheet 34 arranged on the opposite surface of the light guide body 32 opposed to the light exit surface 32b, and an LED (Light Emitting Diode) 36 as a light source as shown in FIG. 2.

The LED 36 is supported by an LED board 37, and the LED board 37 together with the light guide body 32 is fixed on a base (not shown). With the LED board 37 mounted in a predetermined position on the base, the LED 36 is positioned to face a light entrance surface 32a which is the end face of the light guide body 32. Designated reference numeral 38 is a buffer material for lessening a shock that can act on the liquid-crystal panel 2.

When the LED 36 lights, light is guided through the light entrance surface 32a into the light guide body 32, and travels while being reflected from the reflective sheet 34 and the walls of the light guide body 32, and is then output through the light exit surface 32b and then the diffusion sheet 33 as flat light.

Since the liquid-crystal device 1 is constructed as described above, external light is captured into the liquid-crystal panel 2 from the second substrate 7b as shown in FIG. 2 when the external light, such as sunlight or ambient light, is sufficiently strong. The light is then transmitted through the liquid crystal L, is then reflected from the reflective layer 12, and is fed to the liquid crystal L. The first electrodes 14a and the second electrodes 14b sandwiching the liquid crystal L control the liquid crystal L in orientation according to R, G, and B color elements. Light fed to the liquid crystal L is modulated on a color element by color element basis. A combination of light transmitted through the polarizer 17b and light not transmitted through the polarizer 17b thus presents an image such as characters and numbers on the liquid-crystal panel 2. The reflective type display is thus presented.

When no sufficiently strong light is obtained, the LED 36 operates, emitting flat light from the light exit surface 32b of the light guide body 32. The light is fed to the liquid crystal L through the aperture 21 formed in the reflective layer 12. In the same manner as in the reflective type display, the light supplied is modulated through the liquid crystal L which is controlled in orientation on a color element by color element basis, and an image is thus displayed. A transmissive type display is thus presented.

FIG. 4 shows, in enlargement, the connection state of the metal wirings, indicated by an arrow D in FIG. 1, when the liquid-crystal driving IC 3a is mated with the FPC 4 on the substrate extension area 7c of the first substrate 7a in the liquid-crystal device 1 of this embodiment. Referring to FIG. 4, each metal wiring 14e arranged on the substrate extension area 7c is fabricated of an APC alloy. In this embodiment, the metal wirings 14e are supplied with voltages V1–V4 of different levels. For example, the voltages V1–V4 are related as follows:

$$V1 > V2 > V3 > V4$$

When one metal wiring 14e supplied with a high voltage is adjacent to another metal wiring 14e supplied with a low voltage, a guard wiring 29 fabricated of ITO which is an electrically conductive oxide is interposed between these two metal wirings 14e. Referring to FIG. 4, guard wirings 29 are arranged with one between V1 and V2, another between V2 and V3, and yet another between V3 and V4. Designated reference numeral 3a is the liquid-crystal driving IC, and designated reference numeral 39 is a bump, namely, a terminal formed on the liquid-crystal driving IC 3a.

Even when the metal wirings 14e supplied with equal voltages are adjacent to each other, no guard wirings are arranged therebetween. As shown in FIG. 4, a plurality of metal wirings 14e are supplied with voltage V4, and no guard wiring 29 is provided therebetween.

Generally, when a voltage difference occurs between the metal wirings 14e of the APC alloy, in other words, when the relationship of cathode and anode occurs between metal wirings, the anode metal wiring 14e supplied with a higher voltage suffers from corrosion and damage. In contrast, the metal wiring 14e is free from corrosion if the electrically conductive oxide ITO is interposed between the anode metal wiring and the cathode metal wiring in this embodiment.

Since the entire anode metal wiring 14e is covered with the electrically conductive oxide ITO, the anode metal wiring 14e is more reliably protected from corrosion. The same effect is expected even if ITO covers a portion of the anode metal wiring 14e rather than the entire anode of the metal wiring 14e. In this embodiment, the ITO covering the anode metal wiring 14e is connected to the ITO forming the guard wiring 29, and the anode metal wiring 14e and the guard wiring 29 are set to be equal in voltage level. The anode metal wiring 14e is thus reliably prevented from being corroded.

As described above, the metal wiring 14e is fabricated of the APC alloy having a low electrical resistance. Even a long pattern of the metal wiring 14e is used, the total resistance thereof is still low. Signal exchange is thus reliably performed between the circuit 26 on the FPC 4 and the liquid-crystal driving IC 3a. When the metal wiring 14e is fabricated of the APC alloy, there is a high possibility that the anode metal wiring suffers from corrosion. However, since this embodiment allows the electrically conductive oxide to be placed between the anode metal wiring and the cathode metal wiring, the corrosion problem of the metal wiring is resolved.

The wiring structure that the guard wiring 29 of the electrically conductive oxide is interposed between the anode metal wiring 14e and the cathode metal wiring 14e as shown in FIG. 4 is applied not only to the metal wiring 14e in the liquid-crystal driving IC 3a shown in FIG. 1 but also to the metal wiring 14f for the other liquid-crystal driving IC 3b. In this case, the length of the metal wiring 14f becomes longer because the liquid-crystal driving IC 3b is located farther from the FPC 4.

If a long pattern of the metal wiring 14f is fabricated of an oxide such as ITO, the total electrical resistance of the pattern becomes too high, and reliable operation of the liquid-crystal driving IC 3b cannot be assured. In contrast, the metal wiring 14f is fabricated a low electrical resistance APC alloy in this embodiment, the total resistance of the metal wiring 14f is low, and a reliable operation of the liquid-crystal driving IC 3b is thus assured. By allowing the ITO of electrically conductive oxide to be interposed between the anode metal wiring 14f and the cathode metal wiring 14f, the anode metal wiring is reliably protected from corrosion.

The guard wiring 29 is set to an appropriate length. Referring to FIG. 4, the guard wiring 29 may be set to be as long as the metal wiring 14e, or the guard wiring 29 may be set up close to a portion of the metal wiring 14e where corrosion most likely occurs.

FIG. 5 shows a second embodiment, which is a modification of the metal wiring shown in FIG. 4. The second embodiment shown in FIG. 5 remains identical to the embodiment shown in FIG. 4 in that voltages V1–V4 of different voltage levels are supplied to a plurality of metal wirings 14e, and in that the guard wiring 29 of the electrically conductive oxide ITO is interposed between the anode metal wiring 14e supplied with a high voltage and the cathode metal wiring 14e supplied with a low voltage.

The second embodiment shown in FIG. 5 is different from the embodiment shown in FIG. 4 in that the ITO is removed from the top of the metal wiring 14e. Even when the ITO is not laminated on the metal wiring 14e, the anode metal wiring is protected from corrosion.

FIG. 6 shows a third embodiment, which is a modification of the metal wiring shown in FIG. 4. The third embodiment shown in FIG. 6 remains identical to the embodiment shown in FIG. 4 in that voltages V1–V4 of different voltage levels are supplied to a plurality of metal wirings 14e, in that the guard wiring 29 of the electrically conductive oxide ITO is interposed between the anode metal wiring 14e supplied with a high voltage and the cathode metal wiring 14e supplied with a low voltage, and in that the metal wiring 14e is covered with the ITO that forms the guard wiring 29.

The difference of the third embodiment shown in FIG. 6 from the embodiment shown in FIG. 4 is that the guard wiring 29 is disconnected from an ITO covering layer 41 of the metal wiring 14e. The guard wiring 29 is set to be floating. In this case as well, the anode metal wiring is protected from corrosion.

FIG. 7 and FIG. 8 show a fourth embodiment of the wiring substrate of the present invention. The structure of the wiring substrate shown here is applied to the connection section between the substrate extension area 7c of the first substrate 7a and the metal wiring terminals 27 of the FPC 4.

In the fourth embodiment, the first substrate 7a shown in FIG. 7(a) functions as one wiring substrate element, and the FPC 4 shown in FIG. 7(b) functions as the other wiring substrate element. These wiring substrate elements are connected to each other as shown in FIG. 8. Specifically, the FPC 4 is connected to the substrate extension area 7c of the first substrate 7a using the ACF 22 as shown in FIG. 1, and a single substrate is thus constructed of the first substrate 7a and the FPC 4 as a unit.

Referring to FIG. 7(a), in this embodiment, the metal wiring 14e is fabricated of a metal such as an APC alloy on the surface of the substrate extension area 7c, and a covering layer 41 fabricated of an electrically conductive oxide ITO is laminated on the metal wiring 14e. Guard wirings 29 are arranged, each between an anode terminal supplied with a high voltage and a cathode terminal supplied with a low voltage, among the metal wiring terminals 27 of the FPC 4 to be connected to the substrate extension area 7c. The guard wiring 29 is connected to the metal wiring terminal 27 for the same voltage in this embodiment, but alternatively, both may be disconnected from each other to put the guard wiring 29 into a floating state.

Since the metal wiring 14e on the substrate extension area 7c and the metal wiring terminal 27 on the FPC 4 are arranged as described above in this embodiment, the guard wiring 29 of the FPC 4 is positioned between the anode metal wiring 14e and the cathode metal wiring 14e on the substrate extension area 7c as shown in FIG. 8 when the substrate extension area 7c is connected to the FPC 4. As a result, even when the metal wiring 14e is fabricated of the APC metal which is corrodible when used as an anode, such corrosion problem is resolved by the use of the guard wiring 29 between the anode metal wiring 14e and the cathode metal wiring 14e.

FIG. 9 and FIG. 10 show a fifth embodiment of the liquid-crystal device as a display device of the present invention. FIG. 9 is a similar to the sectional view of the liquid-crystal device 1 in FIG. 2, but showing the fifth embodiment. Since the external view of a liquid-crystal device 51 shown in FIG. 9 is substantially identical to the one shown in FIG. 1, an perspective view of the liquid-crystal device 51 is not shown. In FIG. 9, components described with reference to FIG. 2 are designated with the same reference numerals, and the discussion thereof is skipped.

Like the embodiment shown in FIG. 2, the liquid-crystal device 51 of this embodiment shown in FIG. 9 is also a passive matrix, transflective, full-color liquid crystal device. The liquid-crystal device 51 is different from the liquid-crystal device 1 shown in FIG. 2 in that the first electrodes 14a are substituted for the reflective layer 12 in the liquid-crystal device 1 shown in FIG. 1 and is fabricated of a light reflective material such as an APC alloy or Cr and thus serves as an internal reflective layer. In this embodiment, the first electrodes 14a are made of a metal wiring rather than an oxide.

Specifically, striped first electrodes 14a, if viewed from an arrow A, are formed on the inner surface of a base member 11a (on the top surface of the base member 11a in FIG. 9) in the first substrate 7a in the liquid-crystal device 51. An alignment layer 16a is formed on the first electrodes 14a. A polarizer 17a is glued onto the external surface of the base member 11a (on the underside of the base member 11a in FIG. 9). Apertures 21 are opened at color elements on the first electrodes 14a fabricated of the APC alloy or the like where the first electrodes 14a intersect the second electrodes 14b as shown in FIG. 10. As a result, the apertures 21 are formed in the same dot matrix as that of the color elements, if viewed from the arrow A in FIG. 9.

Since the liquid-crystal device 51 of this embodiment is constructed as described above, external light is captured into the liquid-crystal panel 2 from the second substrate 7b as shown in FIG. 9 when the external light, such as sunlight or ambient light, is sufficiently strong. The light is then transmitted through the liquid crystal L, is then reflected from the first electrodes 14a, and is fed back to the liquid crystal L. The first electrodes 14a and the second electrodes 14b sandwiching the liquid crystal L control the liquid crystal L in orientation according to R, G, and B color elements. Light fed to the liquid crystal L is modulated on a color element by color element basis. A combination of light transmitted through the polarizer 17b and light not transmitted through the polarizer 17b thus presents an image such as characters and numbers on the liquid-crystal panel 2. The reflective type display is thus presented.

When no sufficiently strong light is obtained, the LED 36 operates, emitting flat light from the light exit surface 32b of the light guide body 32. The light is fed to the liquid crystal L through the aperture 21 formed in the first electrodes 14a.

In the same manner as in the reflective type display, the light supplied is modulated through the liquid crystal L which is controlled in orientation on a color element by color element basis, and an image is thus displayed. A transmissive type display is thus presented.

In this embodiment, the first electrodes 14a are fabricated of a metal such as the APC alloy, and the extension lines 14c which respectively lead from the first electrodes 14a outwardly out of the sealing member 8 are also fabricated of a metal wiring such as the APC alloy in FIG. 1. The extension lines 14d, which are respectively connected to the second electrodes 14b on the second substrate 7b through electrically conductive members 9 dispersed in the sealing member 8, are also fabricated of a metal wiring such as the APC alloy.

In the embodiment shown in FIG. 2, the extension lines 14c and 14d, which are output wirings of the liquid-crystal driving ICs 3a and 3b, are fabricated of ITO, namely, an oxide in the substrate extension area 7c shown in FIG. 1. The metal wirings 14e and 14f, which are input wirings of the liquid-crystal driving ICs 3a and 3b, are fabricated of a metal, such as an APC alloy. To prevent the metal wirings 14e and 14f, any of which works as an anode, from being corroded, the guard wiring 29 is interposed between the anode metal wiring and the cathode metal wiring as shown in FIG. 4, FIG. 5, FIG. 6, FIG. 7, and FIG. 8. The anode metal wiring is thus protected from corrosion.

Since in the embodiment shown in FIG. 9, not only the metal wirings 14e and 14f but also extension lines 14c and 14d are fabricated of metals in FIG. 1, there is a possibility that any of the extension lines 14c and 14d functioning as an anode is corroded. To prevent corrosion in the embodiment shown in FIG. 9, the guard wiring 29 fabricated of an electrically conductive oxide such as an ITO is interposed between the extension lines 14c of the liquid-crystal driving IC 3a and between the extension lines 14d of the liquid-crystal driving IC 3b, respectively, as shown in FIG. 11.

The embodiment in which the guard wiring 29 is interposed between the metal extension lines 14c and the metal extension lines 14d is not limited to the structure shown in FIG. 11. Each of the structures shown in FIG. 4, FIG. 5, FIG. 6, FIG. 7 and FIG. 8 may be adopted. The extension lines 14c are directly connected to the first electrodes 14a within the effective display area B. Since the first electrodes 14a are also fabricated of a metal wiring, the guard wiring 29 may extend not only along the extension lines 14c but also along the first electrodes 14a. Referring to FIG. 11, the wiring connected to input bumps 59b of the liquid-crystal driving ICs 3a and 3b may have the same structure as those shown in FIG. 4, FIG. 5, FIG. 6, FIG. 7, and FIG. 8.

FIG. 12 shows one embodiment of a semiconductor chip of the present invention and a wiring substrate in which the semiconductor chip is appropriately used. The wiring structure shown in FIG. 12 may be applied to, although not limited to, the liquid-crystal device 1 shown in FIG. 1. If the wiring structure is applied to the liquid-crystal driving IC 3a of the liquid-crystal device 1 shown in FIG. 1, the wiring structure shown in FIG. 12 looks like the liquid-crystal driving IC 3a viewed from the rear side of the first substrate 7a as shown by an arrow E in FIG. 1.

A semiconductor chip 61 used as the liquid-crystal driving IC 3a is now discussed, referring to FIG. 12. The semiconductor chip 61 includes a plurality of bumps, i.e., a plurality of output bumps 69a, and a plurality of input bumps 69b. The count of these bumps is not limited to the one shown in FIG. 12, and may be larger or smaller than the count shown in FIG. 12.

The semiconductor chip 61 is bonded to the base member 11a of the first substrate 7a through the ACF 22. A plurality of spaced extension lines 14c are fanned out in stripes on the surface of the base member 11a. The extension lines 14c respectively extend to the first electrodes 14a in FIG. 1. A plurality of spaced metal wirings 14e are formed on the base member 11a on the opposed side of the semiconductor chip 61 to the extension lines 14c.

The extension lines 14c and the metal wirings 14e are fabricated of a metal such as an APC alloy, Cr, Au, Al, Nd, or Ti. Guard wirings 29, fabricated of an electrically conductive oxide such as ITO, are interposed between the extension lines 14c and between the metal wirings 14e. A circuit formed within the semiconductor chip 61 is arranged so that a bump connected an extension line 14c and a bump connected to a metal wiring 14e are set to be low voltage while bumps adjacent to the low-voltage bumps, namely, bumps connected to the guard wiring 29 are set to be high voltage. As shown, each high-voltage bump is set to be high in voltage in the semiconductor chip 61 through a wiring 63.

In this embodiment, the guard wiring 29 arranged between the extension lines 14c is a dummy wiring that contributes nothing to electrical conduction. However, it is perfectly acceptable for the guard wiring 29 to be used as a signal line for conducting a signal or a voltage supply line for supplying a driving voltage for driving a variety of electrical components.

In this embodiment, lines of bumps 69a and 69b of the semiconductor chip 61 are arranged so that a low-voltage terminal and a high-voltage terminal alternate with each other in each line. The low-voltage terminals are connected to the extension lines 14c and the metal wirings 14e, while the guard wirings 29 are connected to the high-voltage lines. In this wiring structure, the guard wirings 29 fabricated of an electrically conductive oxide are arranged, each between the adjacent extension lines 14c and between the adjacent metal wirings 14e. The metal wirings working as an anode is prevented from being corroded.

In this embodiment, a line of bumps in the semiconductor chip 61 is arranged so that a high-voltage terminal and a low-voltage terminal alternate with each other in the line. With the guard wiring 29 connected to the high-voltage bump, the extension lines 14c and the metal wirings 14e are reliably protected from corrosion.

FIG. 13 and FIG. 14 shows a seventh embodiment in which the display device of the present invention is implemented as an EL device. The EL device 71 is a passive matrix type with no active elements employed, and is a monochrome EL device using a single color EL emission layer.

The EL device 71 includes a substrate 77 fabricated of transparent glass or transparent plastic. Referring to FIG. 14, electrodes 74a, striped if viewed from an arrow A, are formed on the surface of the substrate 77. A monochrome EL light emission layer H is deposited to a uniform thickness on the first electrodes 74a. Second electrodes 74b, striped if viewed from the arrow A, are laminated on the EL light emission layer H. The first electrodes 74a and the second electrodes 74b mutually intersect each other at right angles. Pixels are respectively arranged at the intersections. The pixels are arranged in a dot matrix, if viewed from the arrow A, and the pixels arranged in a dot matrix form an effective display area B.

The first electrodes 74a are fabricated of an electrically conductive, transparent material, such as an ITO. The second electrodes 74b are fabricated of a light reflective material, such as an APC alloy, Cr, Au, Al, Nd, or Ti. A sealing member 78, having a ring configuration if viewed from the arrow A, is arranged on the second electrodes 74b of the substrate 77. A cover 79 is attached to the sealing member 78.

Referring to FIG. 13, the first electrodes 74a arranged on the surface of the substrate 77 respectively include extension lines 74c outwardly leading out of the sealing member 78. The extension lines 74c are respectively connected to output terminals, i.e., output bumps of a liquid-crystal driving IC 73a through an ACF, for example. The second electrodes 74b respectively include extension lines 74d outwardly leading out of the sealing member 78. The extension lines 74d are respectively connected to output terminals, i.e., output bumps of a liquid-crystal driving IC 73b through an ACF, for example. Like the first electrodes 74a, the extension lines 74c are fabricated of the ITO, namely, an electrically conductive oxide. Like the second electrodes 74b, the extension lines 74d are fabricated of a reflective metal such as an APC alloy.

Terminal wirings 74e and 74f are formed on the edge portions of the substrate 77. Wiring connection elements FPC 75a and 75b are respectively bonded to the edge portions using electrically conductive elements such as ACF. The terminal wirings 74e and 74f are respectively connected to terminal wirings formed on the FPC 75a and FPC 75b. In this way, the liquid-crystal driving ICs 73a and 73b are driven by unshown external circuits. The terminal wirings 74e and 74f are fabricated of a metal such as an APC alloy.

In the EL device 71 thus constructed, a current flowing between the first electrode 74a and the second electrode 74b is controlled on a pixel by pixel basis, thereby selectively causing the pixels to light. An image of characters and numerals is presented on the effective display area B. The second electrodes 74b also function as a reflective layer.

In this embodiment, referring to FIG. 13, the extension lines 74d, the terminal wirings 74e, and the terminal wirings 74f, each formed of a metal wiring of an APC alloy and functioning as an anode, may suffer from corrosion. As already described in connection with the relationship between the metal wirings 14e and the guard wirings 29 with reference to FIG. 4, FIG. 5, FIG. 6, FIG. 7, FIG. 8, and FIG. 12, a guard wiring of an electrically conductive oxide is interposed between adjacent ones of a plurality of wirings to prevent corrosion. The specific wiring structure may be selected from the ones shown in FIG. 4, FIG. 5, FIG. 6, FIG. 7, FIG. 8, and FIG. 12.

Besides a passive matrix type, the EL device may be of an active matrix type, in which each pixel includes a TFT (Thin-Film Transistor) or a TFD (Thin-Film Diode). In this case, referring to FIG. 13 and FIG. 14, active matrix elements are arranged in a dot matrix on the inner surface of the substrate 77, the first electrodes 74a are formed as a matrix of pixel electrodes, and the pixel electrodes are respectively connected to the active matrix elements.

Some EL devices present a full-color display, in addition to the monochrome display described above. There are a variety of structures for presenting a full-color display. One of these structures two-dimensionally arranges EL emission color elements of R (red), G (green), and B (blue) to form an EL emission layer.

The structure of this invention in which a guard wiring is interposed between a plurality of metal wirings is applied to a variety of EL devices including the active matrix EL device and the full-color display EL device.

FIG. 15 shows an embodiment of electronic equipment of the present invention. The electronic equipment includes a display information output source 80, a display information processing circuit 81, a power source circuit 82, a timing generator 83, and a liquid-crystal device 84 as a display device. The liquid-crystal device 84 includes a liquid-crystal panel 85 and a driving circuit 86. The liquid-crystal device 84 may be the liquid-crystal device 1 shown in FIG. 1.

The display information output source 80 includes a memory, such as a ROM (Read Only Memory), a RAM (Random Access Memory), or a storage unit such as one of a variety of disks, and a tuning circuit for outputting a digital video signal, and outputs to the display information processing circuit 81 display information such as a video signal in a predetermined format in response to a clock signal from the timing generator 83.

The display information processing circuit 81 includes a variety of known circuits such as a serial-parallel converter circuit, an amplifier and polarity reversal circuit, a rotation circuit, a gamma correction circuit, and a clamp circuit, and processes input display information, and supplies a video signal to a driving circuit 86 together with a clock signal CLK. The driving circuit 86 includes a scanning line driving circuit, a data line driving circuit, and a test circuit. The power source circuit 82 feeds a variety of voltages to each block of the liquid-crystal device 84.

FIG. 16 shows a mobile telephone as one embodiment of the electronic equipment of the present invention. The electrical system of the mobile telephone is constructed using the embodiment shown in FIG. 15. The mobile telephone 90 includes a plurality of control buttons 91, and a liquid-crystal device 92. The liquid-crystal device 92 may be the liquid-crystal device 1 shown in FIG. 1.

Each of the electronic equipment shown in FIG. 15 and the electronic equipment shown in FIG. 16 includes the liquid-crystal device 1 shown in FIG. 1, and has one of the wiring structure shown in FIG. 4, FIG. 5, FIG. 6, FIG. 7, FIG. 8, and FIG. 12, in which the guard wiring fabricated of the electrically conductive oxide is interposed between the metal wirings. Degradation in image quality due to electrode corrosion is thus prevented.

The electronic equipment shown in FIG. 15 and FIG. 16 is not limited to the one including the liquid-crystal device. When the electronic equipment includes a wiring substrate other than that contained in the liquid-crystal device, the wiring substrate may have any of the wiring structures shown in FIG. 4, FIG. 5, FIG. 6, FIG. 7, FIG. 8, and FIG. 12.

Preferred embodiments of the present invention have been discussed. The present invention is not limited to these embodiments and various changes and modifications are possible within the scope of the present invention.

The liquid-crystal device shown in FIG. 1 has been discussed for illustrative purposes only, and besides the liquid-crystal device 1 shown in FIG. 1, various structures to which the wiring structure of the present invention is applied are contemplated. For example, the liquid-crystal device shown in FIG. 1 is of a passive matrix type. Alternatively, the present invention may be applied to an active matrix type liquid-crystal device.

In the liquid-crystal device shown in FIG. 1, the extension lines 14c and 14d and the metal wirings 14e and 14f are formed on the first substrate 7a only. Alternatively, a substrate extension area, which outwardly projects out of the first substrate 7a, may be formed on the second substrate 7b. Extension lines and terminal wirings are formed both substrate extension areas.

The liquid-crystal devices shown in FIG. 1 and FIG. 9 are of an internal-reflection type liquid-crystal device in which a reflective layer is arranged within the liquid-crystal panel 2. Alternatively, the present invention may be applied to an external-reflection type liquid-crystal device in which a reflective layer is arranged external to the liquid-crystal panel.

As discussed above, in the wiring substrate, the display device, and the electronic equipment of the present invention, the guard wiring is interposed between the adjacent metal wirings. Even when a voltage difference occurs between the adjacent metal wirings, in other words, the relationship of cathode and anode occurs therebetween, the anode metal wiring is protected from corrosion. The electrical performance of the wiring substrate is maintained at a desired level for a long period of time. The semiconductor chip of the present invention permits the above wiring structure to be easily constructed.

The entire disclosure of Japanese Patent Application No. 2000-26073 filed Oct. 25, 2000 is incorporated by reference.

What is claimed is:

1. A display device, comprising:
   a first substrate;
   a second substrate disposed opposite the first substrate;
   a liquid crystal layer interposed between the first and second substrates;
   an effective display area including a plurality of pixels arranged in a matrix;
   a plurality of metal wirings arranged on the first substrate; and
   a guard wiring formed on the first subtrate fabricated of an electrically conductive metal oxide having a higher resistance than a material of the metal wirings and arranged between at least a pair of mutually adjacent metal wirings of the plurality of metal wirings, the guard wiring covering and contacting at least a portion of one of the pair of adjacent metal wirings;
   wherein the guard wiring is applied with a voltage that is the same as a voltage that is applied to the one of the pair of adjacent metal wirings and different than a voltage that is applied to the other of the pair of adjacent metal wirings.

2. The wiring substrate according to claim 1, wherein the guard wiring is connected to one of the pair of metal wiring which is an anode.

3. The wiring substrate according to claim 1, wherein an electrically conductive oxide layer fabricated of the same material as that of the guard wiring is laminated on the surface of the metal wiring.

4. The wiring substrate according to claim 1, wherein the metal wiring is fabricated of at least a metal selected from or an alloy containing at least one metal selected from the group consisting of Au, Ag, Pd, Cu, Cr, Al, Nd, and Ti.

5. The wiring substrate according to claim 1, wherein the electrically conductive oxide comprises one of ITO and tin oxide.

6. A display device, comprising:
   a first substrate;
   a second substrate disposed opposite the first substrate;
   a liquid crystal layer interposed between the first and second substrates;
   an effective display area including a plurality of pixels arranged in a matrix;
   a plurality of metal wirings at a position of the first substrate external to the effective display area, at least an adjacent pair of the plurality of metal wirings being applied with different voltages; and
   a guard wiring formed on the first subtrate fabricated from an electrically conductive oxide and arranged between at least the pair of adjacent metal wirings.

7. The wiring substrate according to claim 6, wherein the guard wiring is applied with the same voltage as one of the pair of adjacent metal wirings.

* * * * *

UNITED STATES PATENT AND TRADEMARK OFFICE
CERTIFICATE OF CORRECTION

PATENT NO. : 7,148,427 B2  Page 1 of 1
APPLICATION NO. : 10/000841
DATED : December 12, 2006
INVENTOR(S) : Yasuhito Aruga et al.

It is certified that error appears in the above-identified patent and that said Letters Patent is hereby corrected as shown below:

Title page, (75) Inventors:  "Matsanoto" should be --Matsumoto--

Column 17, Line 17:  "2000-26073" should be --2000-326073--

Signed and Sealed this

Twenty-seventh Day of May, 2008

JON W. DUDAS
*Director of the United States Patent and Trademark Office*